(12) United States Patent
Shiraishi

(10) Patent No.: US 9,030,645 B2
(45) Date of Patent: May 12, 2015

(54) ILLUMINATION OPTICAL SYSTEM, EXPOSURE APPARATUS, AND EXPOSURE METHOD

(75) Inventor: Masayuki Shiraishi, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1148 days.

(21) Appl. No.: 12/502,474

(22) Filed: Jul. 14, 2009

(65) Prior Publication Data

US 2010/0033699 A1 Feb. 11, 2010

Related U.S. Application Data

(60) Provisional application No. 61/129,857, filed on Jul. 24, 2008.

(30) Foreign Application Priority Data

Jul. 14, 2008 (JP) ................................. 2008-182444

(51) Int. Cl.
G03B 27/54 (2006.01)
G03F 7/20 (2006.01)

(52) U.S. Cl.
CPC ............ G03F 7/702 (2013.01); G03F 7/70075 (2013.01); G03F 7/70083 (2013.01)

(58) Field of Classification Search
USPC ..................................... 355/67; 359/850, 864
See application file for complete search history.

(56) References Cited

U.S. PATENT DOCUMENTS

| | | | |
|---|---|---|---|
| 5,963,305 | A | 10/1999 | Mizouchi |
| 6,452,661 | B1 | 9/2002 | Komatsuda |
| 7,006,595 | B2 | 2/2006 | Singer et al. |
| 2002/0017616 | A1 | 2/2002 | Ota |
| 2007/0041004 | A1 * | 2/2007 | Suzuki ........................... 355/67 |
| 2007/0206383 | A1 * | 9/2007 | Broude et al. ................ 362/268 |

FOREIGN PATENT DOCUMENTS

| | | |
|---|---|---|
| JP | 10-092730 | 4/1998 |
| JP | 10-189431 | 7/1998 |
| JP | 11-345761 | 12/1999 |
| WO | WO 99/36832 | 7/1999 |
| WO | WO 9936832 A1 * | 7/1999 |

OTHER PUBLICATIONS

Office Action of the Taiwan Intellectual Property Office in Taiwanese Patent Application No. 098123566, dated Jun. 23, 2014.

* cited by examiner

*Primary Examiner* — Glen Kao
(74) *Attorney, Agent, or Firm* — Finnegan, Henderson, Farabow, Garrett & Dunner LLP

(57) ABSTRACT

In an illumination optical system, a light flux from a light source is made to come into a first fly's eye optical system, and an illumination area is illuminated, via a second fly's eye optical system and a condenser optical system, with light fluxes from a plurality of mirror elements which construct the first fly's eye optical system, wherein a reflecting surface of each of the mirror elements has a width in one direction narrower than a width of each of the mirror elements in a direction perpendicular to the one direction, and a reflectance distribution in the one direction of each of the mirror elements is trapezoidal. The intensity distribution of the illumination area can be set to be a nonuniform distribution, and respective points in the illumination area can be illuminated with the light fluxes having an approximately same aperture angle distribution.

46 Claims, 12 Drawing Sheets

ILLUMINATION OPTICAL SYSTEM, EXPOSURE APPARATUS, AND EXPOSURE METHOD

CROSS-REFERENCES TO RELATED APPLICATIONS

This application claims the benefit of priority of Japanese Patent Application No. 2008-182444 filed on Jul. 14, 2008 and U.S. Provisional Application No. 61/129,857 filed on Jul. 24, 2008, the entire disclosures of which are incorporated herein by reference.

BACKGROUND OF THE INVENTION

1. Field of the Invention

The present invention relates to an illumination optical system which illuminates an illumination objective surface with a light flux or light fluxes from, for example, an optical integrator, an exposure apparatus provided with the illumination optical system, an exposure method, and a method for producing a device using the exposure apparatus.

2. Description of the Related Art

For example, when a semiconductor device or the like is produced, in order that a pattern formed on a reticle (or a photomask or the like) is transferred onto a wafer (or a glass plate or the like) coated with a resist to perform the exposure, a projection exposure apparatus of the scanning type (scanning type exposure apparatus) such as a scanning stepper or the like is used, which exposes the wafer while synchronously moving the reticle and the wafer with respect to a projection optical system. Recently, in order to enhance the resolution by shortening the wavelength of the exposure light (exposure light beam), those used as the exposure light source include laser light sources such as the KrF excimer laser (wavelength: 248 nm), the ArF excimer laser (wavelength: 193 nm) and the like. Further, an exposure apparatus has been also developed, which employs, as the exposure light, the extreme ultraviolet light (hereinafter referred to as "EUV light (EUV light beam)") having a wavelength of, for example, not more than about 100 nm. Any one of the laser light sources and the light source of the EUV light beam is the pulsed light source.

When the pulsed light beam is used as the exposure light in the scanning type exposure apparatus, any unevenness in the totalized amount of exposure (unevenness in the scanning intensity) arises at respective points on the wafer after the scanning exposure resulting from, for example, the unevenness in the intensity of each of the pulsed lights or the jitter (temporal fluctuation) of the scanning velocity of the stage. A technique for reducing the unevenness in the scanning intensity is the illumination of an illumination area on the reticle with the light flux from the illumination optical system while providing an intensity distribution which has a trapezoidal shape in the scanning direction. For this purpose, those hitherto known include a technique in which a blind is arranged at a position slightly separated from a surface of the pattern (pattern surface) of the reticle or the conjugate plane of the pattern surface, a technique in which illumination areas formed by a plurality of elements included in the optical integrator are deviated or shifted in the scanning direction (see, for example, U.S. Pat. No. 7,006,595), a technique in which the light-exit directions of the light fluxes of the plurality of elements are shifted in the scanning direction (see, for example, Japanese Patent Application Laid-open No. 10-92730), and a technique in which the focal lengths or the sizes of apertures of the plurality of elements are made to differ (see, for example, Japanese Patent Application Laid-open No. 10-189431).

In general, in order to illuminate the respective points on the illumination area by the illumination optical system under a same illumination condition, i.e., with the light fluxes having same distribution of the aperture angle or opening angle (numerical aperture), it is necessary that the light fluxes, from the entire area included in the aperture of the aperture diaphragm of the illumination optical system (hereinafter referred to as "illumination σ"), are irradiated onto the respective points respectively. However, in any one of the conventional techniques for obtaining the trapezoidal shape of the intensity distribution of the illumination area in the scanning direction, the lack or deficiency of the illumination σ arises such that only the light fluxes, which come from a part of the area (partial areas) included in the illumination σ, are radiated onto an area in which the intensity distribution is inclined, thus arising a problem such that the imaging characteristic of the image of such area is deteriorated.

The influence of the deterioration of the imaging characteristic as described above is mitigated owing to the averaging effect brought about by the scanning exposure. However, when the ratio of the area having the inclined intensity distribution in the illumination area is increased in order to further suppress the unevenness in the scanning exposure, for example, especially in the EUV exposure apparatus, it is feared that any necessary imaging characteristic might not be obtained.

Taking the foregoing circumstances into consideration, the present invention provides several aspects, an object of which is to provide an illumination optical system, an exposure apparatus, and an exposure method in which the intensity distribution of the illumination area can be defined or set to be a nonuniform distribution, and in which respective points included in the illumination area can be illuminated under an approximately same illumination condition (with light fluxes having a same aperture angle or opening angle distribution), as well as a technique for producing a device using the exposure apparatus.

SUMMARY OF THE INVENTION

According to a first aspect of the present invention, there is provided an illumination optical system which irradiates a light flux from a light source onto an illumination objective surface, the illumination optical system comprising an integrator having a plurality of optical elements into which the light flux from the light source comes and from which light fluxes exit respectively; wherein a light-incident surface, of each of the optical elements, into which the light flux comes has a width in one direction narrower than a width in a direction perpendicular to the one direction; and a transmittance distribution in the one direction of each of the optical elements is not uniform.

According to a second aspect of the present invention, there is provided an exposure apparatus which projects an image of a part of a pattern onto an object while synchronously moving the pattern and the object in a predetermined scanning direction, the exposure apparatus comprising: an illumination optical system having an integrator including a plurality of optical elements into which a light flux from a light source comes and from which light fluxes exit respectively, the illumination optical system illuminating a first plane with the light fluxes from the optical elements; and a projection optical system which projects the image of the pattern arranged on the first plane onto the object arranged on a second plane; wherein a transmittance distribution of each of the optical elements in a direction corresponding to the scanning direction is not uniform.

According to a third aspect of the present invention, there is provided an exposure method for exposing an object by projecting an image of a pattern onto the object, the exposure method comprising: preparing an optical system in which a plurality of optical elements are arranged, the optical elements each having a transmittance-decreasing portion in which a transmittance is gradually decreased in a predetermined direction; making a light flux from a light source come into the optical elements of the optical system to irradiate, onto a first plane, lights from the optical elements respectively; and projecting the image of the pattern arranged on the first plane onto the object arranged on a second plane, while synchronously moving the pattern and the object in a scanning direction corresponding to the predetermined direction.

According to a fourth aspect of the present invention, there is provided a method for producing a device, comprising exposing an object by using the exposure apparatus or the exposure method of the present invention; and processing the exposed object.

According to the illumination optical system of the present invention, the illumination area, which is irradiated with the light fluxes from the plurality of optical elements in a superimposed or overlay manner, has intensity distribution which is not uniform in the direction corresponding to the one direction of the optical element. Further, the respective points in the illumination area are illuminated with the light fluxes having approximately the same aperture angle.

According to the exposure apparatus and the exposure method of the present invention, the illumination area, which is irradiated with the light fluxes from the plurality of optical elements in a superimposed or overlay manner, has the intensity distribution which is not uniform in the scanning direction. Further, the respective points in the illumination area are illuminated with the light fluxes having approximately the same aperture angle.

BRIEF DESCRIPTION OF THE DRAWINGS

FIG. 4D shows a reflectance distribution of the mirror element 22a.

FIG. 5D shows a reflectance distribution of the mirror element 22a.

DESCRIPTION OF THE PREFERRED EMBODIMENTS

An exemplary embodiment of the illumination optical system, the exposure apparatus, and the exposure method of the present invention will be explained with reference to FIGS. 1 to 6 by way of example.

Figure 1:
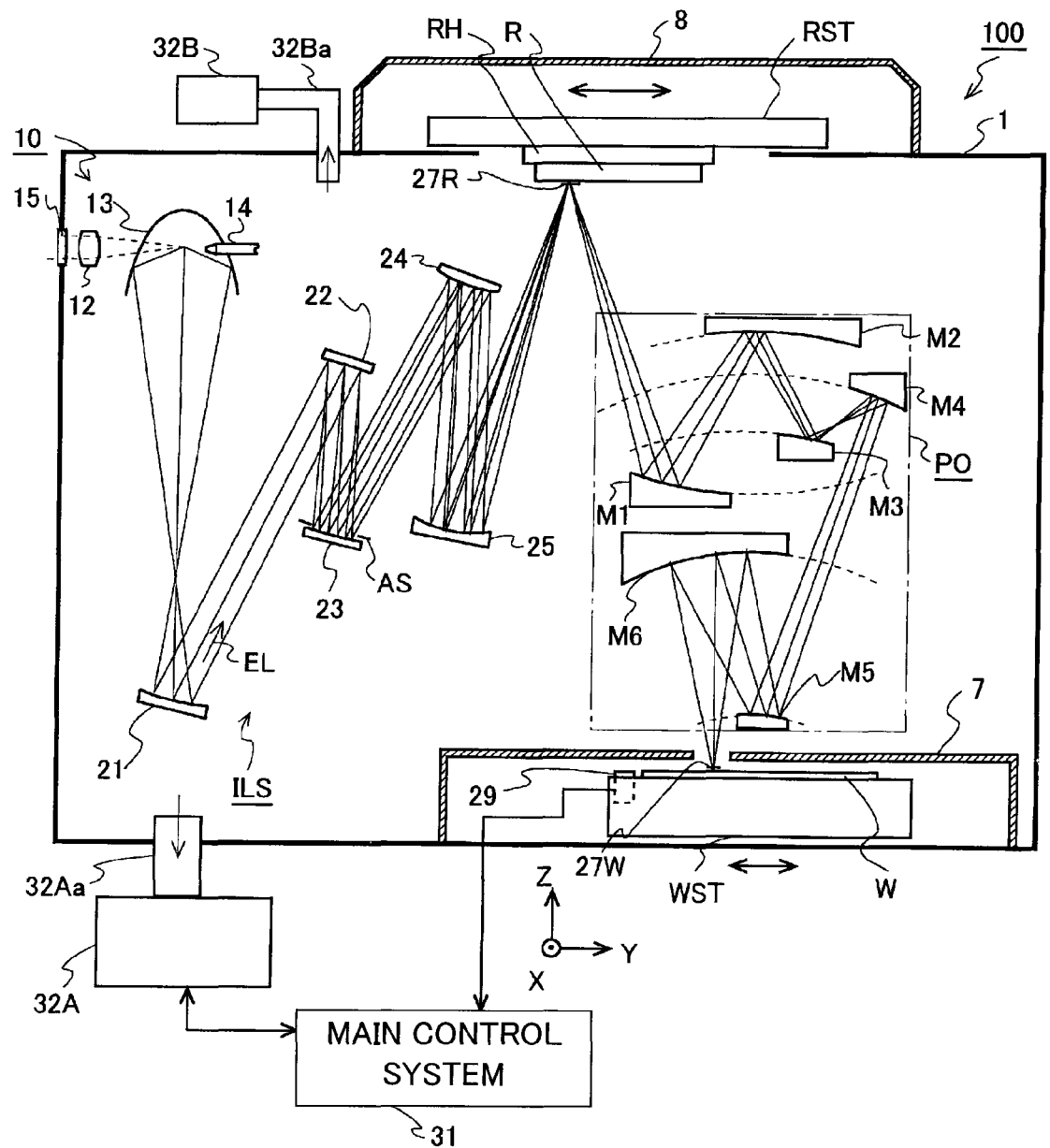
FIG. 1 is a sectional view of a schematic construction of an exemplary exposure apparatus of an embodiment of the present invention.

FIG. 1 is a sectional view schematically illustrating the overall construction of an exposure apparatus (EUV exposure apparatus) 100 of this embodiment which uses, as the illumination light EL (exposure light), the EUV light having a wavelength within a range of about 3 to 50 nm that is not more than about 100 nm, for example, a wavelength of 11 nm or 13 nm. With reference to FIG. 1, the exposure apparatus 100 includes a laser plasma light source 10 which pulse-generates the illumination light EL; an illumination optical system ILS which illuminates an illumination area 27R on a pattern surface (lower surface in this embodiment) of a reticle R (mask) with the illumination light EL; a reticle stage RST which moves the reticle R; and a projection optical system PO which projects an image of a pattern included in the illumination area 27R of the reticle R onto a wafer W (photosensitive substrate) coated with a resist (photosensitive material). The exposure apparatus 100 further includes a wafer stage WST which moves the wafer W, a main control system 31 which includes a computer integrally controlling the operation of the entire apparatus, etc.

In this embodiment, the EUV light is used as the illumination light EL. Therefore, each of the illumination optical system ILS and the projection optical system PO is constructed of a plurality of catoptric optical members, except for specific filters or the like (not shown), and the reticle R is also of the catoptric or reflecting type. The catoptric optical member has a reflecting surface obtained, for example, such that a surface of a member, which is formed of silica glass (or highly heat resistant metal or the like), is processed highly accurately into a predetermined curved surface or flat surface, and then a multilayered film (reflective film for the EUV light), which is composed of molybdenum (Mo) and silicon (Si), is formed on the surface to thereby provide the reflecting surface. The multilayered film may be another multilayered film obtained by combining a substance such as ruthenium (Ru), rhodium (Rh) or the like and a substance such as Si, beryllium (Be), carbon tetraboride ($B_4C$) or the like. The reticle R is prepared as follows. That is, for example, a multilayered film is formed on a surface of a substrate made of silica glass to provide a reflecting surface. After that, a transfer pattern is formed on the reflecting surface with an absorbing layer made of a material absorbing the EUV light, including, for example, tantalum (Ta), nickel (Ni), chromium (Cr) and the like.

In order to avoid the absorption of the EUV light by the gas, the exposure apparatus 100 is accommodated in a box-shaped vacuum chamber 1 approximately as a whole. Large-sized vacuum pumps 32A, 32B, etc. are provided in order to perform the vacuum evacuation for the space in the vacuum chamber 1, via gas discharge tubes 32Aa, 32Ba, etc. A plurality of subchambers (not shown) are also provided in order to further enhance the degree of vacuum on the optical path for the illumination light EL in the vacuum chamber 1. As an example, the vacuum chamber 1 has an internal gas pressure of about $10^{-5}$ Pa, and a subchamber (not shown), which accommodates the projection optical system PO in the vacuum chamber 1, has an internal gas pressure of about $10^{-5}$ to $10^{-6}$ Pa.

In FIG. 1, the following description will be made assuming that the Z axis extends in the normal line direction of a surface (bottom surface of the vacuum chamber 1) on which the wafer stage WST is placed; the X axis extends perpendicularly to the sheet surface of FIG. 1 in a plane perpendicular to the Z axis; and the Y axis extends in parallel to the sheet surface of FIG. 1. In this embodiment, the illumination area 27R of the illumination light EL on the reticle R has a circular arc-shaped form which is long in the X direction. During the exposure, the reticle R and the wafer W are synchronously scanned in the Y direction (scanning direction) with respect to the projection optical system PO.

At first, the laser plasma light source 10 is a light source of the gas jet cluster system including a high output laser light source (not shown); a light-collecting lens 12 which collects the laser light (laser light beam) from the laser light source via a window member 15 of the vacuum chamber 1; a nozzle 14 which jets a target gas of xenon, etc.; and a light-collecting mirror 13 which has a spheroidal plane-shaped reflecting surface. The illumination light EL, which is pulse-emitted at a frequency of, for example, several kHz from the laser plasma light source 10, is focused or collected on the second focal point of the light-collecting mirror 13. The illumination light EL focused or collected on the second focal point is substantially converted into a parallel light flux via a concave mirror (collimator optical system) 21, and is allowed to come into a first fly's eye optical system 22. The illumination light EL reflected by the first fly's eye optical system 22 is allowed to come into a second fly's eye optical system 23. An optical integrator is constructed by the pair of fly's eye optical systems 22, 23. The illumination light from the laser plasma light source 10, effects the Koehler illumination for the first fly's eye optical system 22.

Figure 2A:
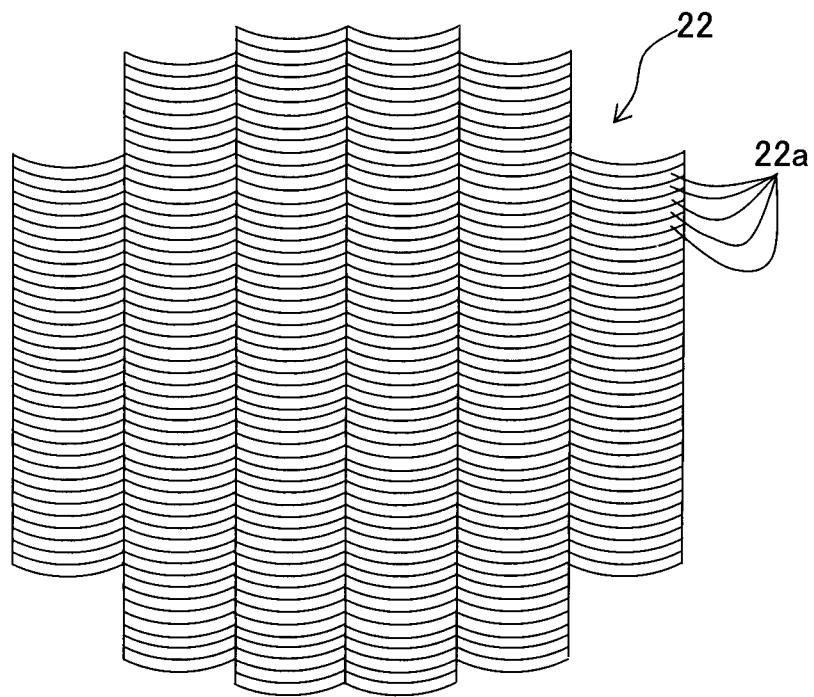
FIG. 2A shows a first fly's eye optical system 22 shown in FIG. 1.
Figure 2B:
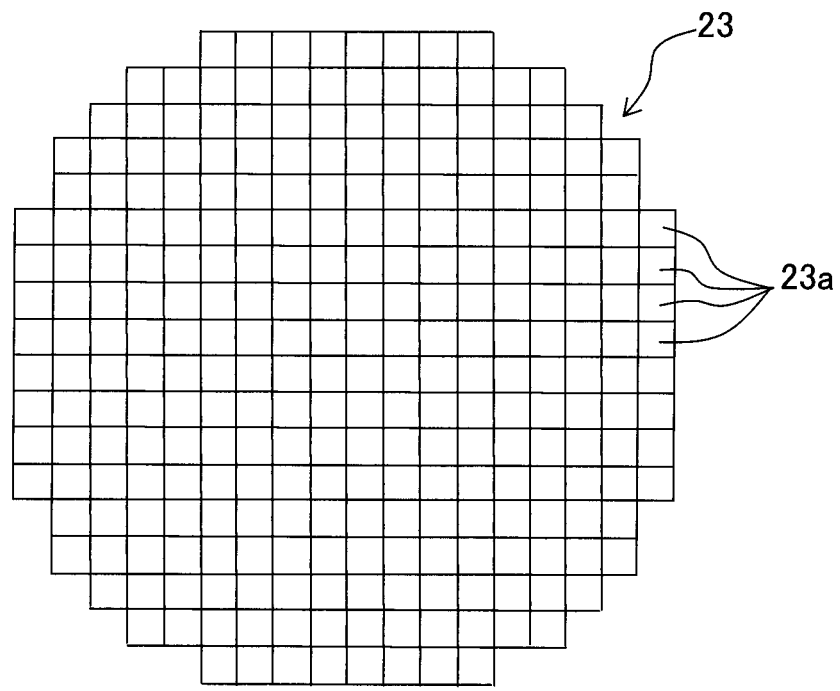
FIG. 2B shows a second fly's eye optical system 23 shown in FIG. 1.

For example, as shown in FIG. 2A, the first fly's eye optical system 22 is constructed by a large number of mirror elements 22a having circular arc-shaped outer shapes similar to the illumination area and arranged two-dimensionally. As shown in FIG. 2B, the second fly's eye optical system 23 is constructed by a large number of mirror elements 23a having rectangular (or substantially square) outer shapes and arranged two-dimensionally corresponding to the large number of mirror elements 22a of the first fly's eye optical system 22. The shapes, the construction, etc. of the respective mirror elements of the fly's eye optical systems 22, 23 are also disclosed, for example, in U.S. Pat. No. 6,452,661.

With reference to FIG. 1, the reflecting surface of each of the mirror elements of the first fly's eye optical system 22 is substantially conjugate with the pattern surface of the reticle R. A substantial surface light source (set or combination of a large number of secondary light sources), which has a predetermined shape, is formed in the vicinity of the reflecting surface of the second fly's eye optical system 23 (in the vicinity of the light-exit surface of the optical integrator). That is, a plane, on which the substantial surface light source is formed, is the pupil plane of the illumination optical system ILS. An aperture diaphragm AS is arranged at the pupil plane or the position disposed in the vicinity of the pupil plane. The aperture diaphragm AS representatively expresses a plurality of aperture diaphragms having apertures of various shapes. By exchanging the aperture diaphragm AS under the control of the main control system 31, it is possible to switch the illumination condition, for example, into the ordinary illumination, the annular or zonal illumination, the dipole illumination, or the quadruple illumination, etc.

The illumination light EL passing through the aperture diaphragm AS is allowed to come into a curved mirror 24. The illumination light EL reflected by the curved mirror 24 is reflected by a concave mirror 25. After that, the illumination light EL illuminates the circular arc-shaped illumination area 27R of the pattern surface of the reticle R obliquely from below, at a uniform illuminance distribution. A condenser optical system is constructed by the curved mirror 24 and the concave mirror 25. Owing to the condenser optical system, the reflected lights (reflected light beams) from the large number of mirror elements of the first fly's eye optical system 22 or the lights (light beams) from the surface light source in the aperture diaphragm AS illuminate the illumination area 27R in a superimposed or overlay manner. The illumination optical system ILS is constructed to include the concave mirror 21, the fly's eye optical systems 22, 23, the aperture diaphragm AS, the curved mirror 24, and the concave mirror 25. In this arrangement, the illumination light EL from the laser plasma light source 10 effects the Koehler illumination for the first fly's eye optical system 22 as well as the pattern surface of the reticle R. In the exemplary embodiment shown in FIG. 1, the curved mirror 24 is a convex mirror. However, the curved mirror 24 may be constructed of a concave mirror, and the curvature of the concave mirror 25 may be decreased in an amount corresponding thereto.

On the other hand, the reticle R is attracted and held on the bottom surface of the reticle stage RST via an electrostatic chuck RH. The reticle stage RST is driven by a predetermined stroke in the Y direction by a driving system (not shown) constructed of, for example, a magnetically floating type two-dimensional linear actuator, on a guide surface parallel to the XY plane of the outer surface of the vacuum chamber 1, based on a measured value obtained by a laser interferometer (not shown) and control information of the main control system 31. Further, the reticle stage RST is also driven in a minute amount in the X direction, a θZ direction (direction of rotation about the Z axis), etc. The reticle R is arranged in a space surrounded by the vacuum chamber 1 through an opening of the upper surface of the vacuum chamber 1. A partition 8 is provided to cover the reticle stage RST on the side of the vacuum chamber 1. The interior of the partition 8 is maintained at a gas pressure between the atmospheric pressure and the gas pressure in the vacuum chamber 1 by an unillustrated vacuum pump.

The illumination light EL reflected by the illumination area 27R of the reticle R is allowed to travel to the projection optical system PO which forms a reduction image of the pattern of the object plane (first plane) on the image plane (second plane). The projection optical system PO is constructed, for example, such that six mirrors M1 to M6 are held by an unillustrated barrel. The projection optical system PO is a catoptric system which is non-telecentric on the side of the object plane (pattern surface of the reticle R) and which is telecentric on the side of the image plane (surface of the wafer W). The projection magnification of the projection optical system PO is a reduction magnification of, for example, ¼-fold. The illumination light EL reflected by the illumination area 27R of the reticle R forms a reduction image of a part of the pattern of the reticle R in an exposure area 27W (area conjugate with the illumination area 27R) on the wafer W via the projection optical system PO.

In the projection optical system PO, the illumination light EL from the reticle R is reflected by the mirror M1 in the upward direction (+Z direction). Subsequently, the illumination light EL is reflected by the mirror M2 in the downward direction. After that, the illumination light EL is reflected by the mirror M3 in the upward direction, and the illumination light EL is reflected by the mirror M4 in the downward direction. Subsequently, the illumination light EL, which is reflected by the mirror M5 in the upward direction, is reflected by the mirror M6 in the downward direction to form the image of the part of the pattern of the reticle R on the wafer W. As an example, the mirrors M1, M2, M4, M6 are concave mirrors, and the other mirrors M3, M5 are convex mirrors.

On the other hand, the wafer W is attracted and held on the wafer stage WST via an electrostatic chuck WH. The wafer stage WST is arranged on a guide surface arranged on the XY plane. The wafer stage WST is driven by predetermined strokes in the X direction and the Y direction by a driving mechanism (not shown) constructed of, for example, a magnetically floating type two-dimensional linear actuator, based on a measured value obtained by a laser interferometer (not shown) and control information of the main control system 31. The wafer stage WST is also driven in the direction of rotation about the Z axis, etc., if necessary.

A radiation amount monitor 29, which includes a plurality of photoelectric sensors arranged, for example, in the X direction, is arranged in the vicinity of the wafer W on the wafer stage WST. A detection signal of the radiation amount monitor 29 is supplied to the main control system 31. By driving the wafer stage WST to move the light-receiving surface of the radiation amount monitor 29 to the exposure area 27W, it is possible to measure the intensity (or the pulse energy) of the illumination light EL at each of the measuring positions in the X direction of the exposure area 27W (illumination area 27R). As an example, the main control system 31 controls, for example, the oscillation frequency and the pulse energy of the laser plasma light source 10 and/or the scanning velocity of the reticle stage RST (and the wafer stage WST) based on the measurement result so that the totalized amount of exposure falls within an allowable range after the scanning exposure at each of the points on the wafer W.

During the exposure, the wafer W is arranged in a partition 7 so that a gas, which is generated from the resist on the wafer W, does not exert any harmful influence on the mirrors M1 to M6 of the projection optical system PO. An opening, through which the illumination light EL is allowed to pass, is formed in the partition 7. The space in the partition 7 is vacuum-evacuated by a vacuum pump (not shown) under the control of the main control system 31.

When one die (shot area) on the wafer W is exposed, the illumination light EL is irradiated onto the illumination area 27R of the reticle R by the illumination optical system ILS; and the reticle R and the wafer W are synchronously moved (subjected to the synchronous scanning) in the Y direction, with respect to the projection optical system PO, at a predetermined velocity ratio in accordance with the reduction magnification of the projection optical system PO. In this way, the reticle pattern in exposed onto one die on the wafer W. After that, the wafer W is step-moved in the X direction and the Y direction by driving the wafer stage WST, and then the next die on the wafer W is subjected to the scanning exposure with the pattern of the reticle R. In this way, the plurality of dies on the wafer W are successively exposed with the pattern of the reticle R in the step-and-scan manner.

Next, an explanation will be made in detail about the construction and function of the fly's eye optical systems 22, 23 (optical integrator) included in the illumination optical system ILS of this embodiment.

Figure 3:
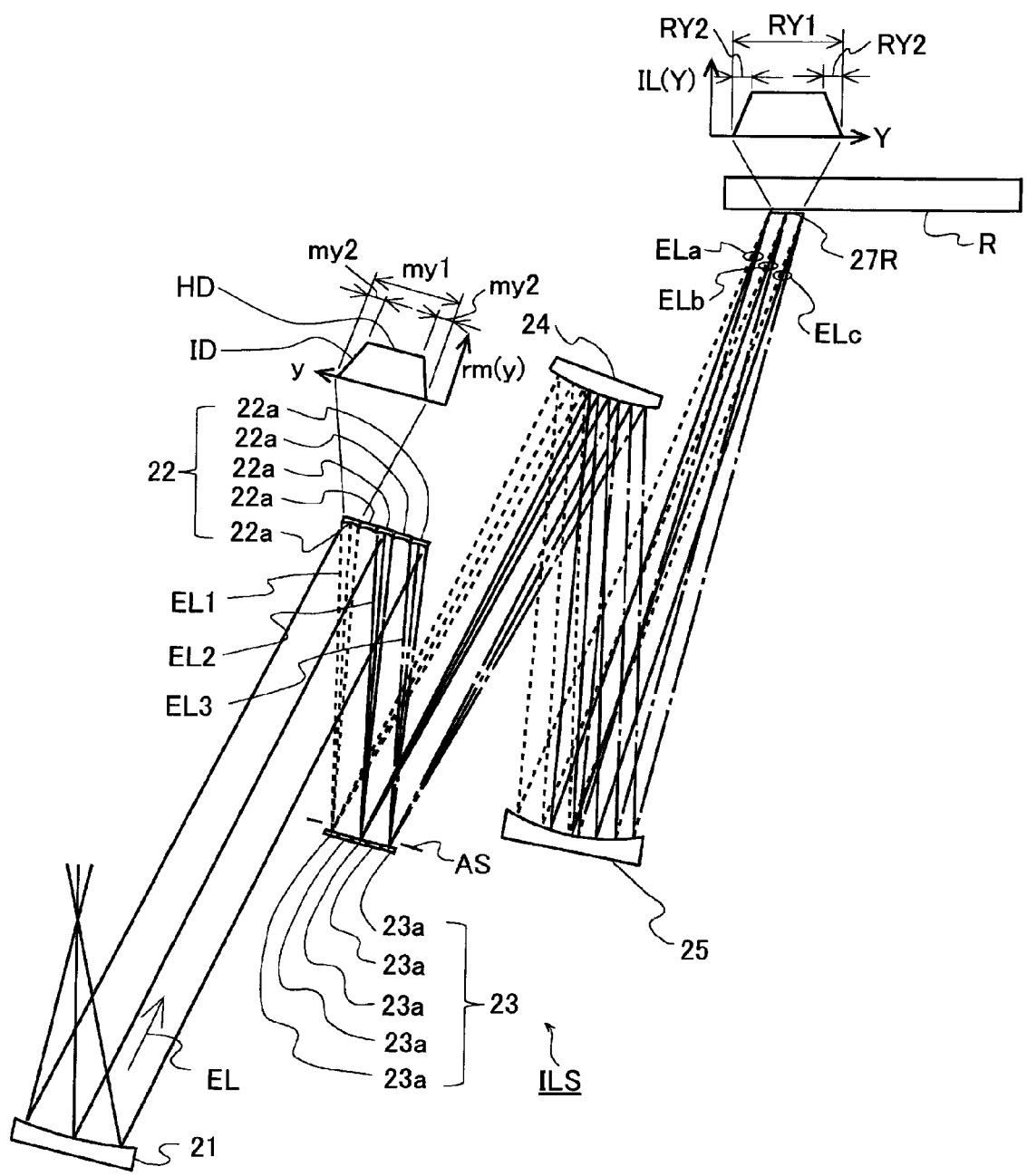
FIG. 3 shows an illumination optical system and a reticle shown in FIG. 1.

FIG. 3 shows the illumination optical system ILS shown in FIG. 1. FIG. 3 representatively shows, in a magnified manner, a plurality of the mirror elements 22a, 23a which are included in one array arranged in a direction corresponding to the Y direction (scanning direction) on the pattern surface of the reticle R, among the large numbers of the mirror elements 22a, 23a constructing the fly's eye optical systems 22, 23 respectively. In FIG. 3, the large number of mirror elements 22a, which construct the first fly's eye optical system 22, have the reflecting surfaces which are substantially conjugate with the pattern surface of the reticle R. The direction, which corresponds to the Y direction on the pattern surface of the reticle R, on the reflecting surface of each of the mirror elements 22a, is designated as the y direction. The reflecting surface of each of the mirror elements 22a has a width my1 in the y direction, and the reflecting surface is, for example, a concave non-spherical surface such as a spheroidal surface or the like. The processing as described later on is applied to the reflecting surface of each of the mirror elements 22a. Accordingly, the reflectance distribution rm(y) in the y direction with respect to the illumination light EL is represented by a trapezoidal pattern having a horizontal portion HS which exhibits a constant reflectance at the central portion in the y direction and inclined portions IS which exhibit reflectances gradually decreased linearly from the horizontal portion on the both sides in the y direction. In the trapezoidal pattern, it is assumed that the entire pattern composed the horizontal portion HS and the two inclined portions IS has a width of my1, and the inclined portions IS disposed on the both sides respectively have a width of my2.

Figure 4B:
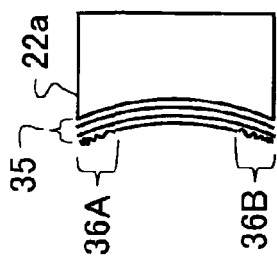
FIG. 4B is a sectional view taken along a line IVB-IVB shown in FIG. 4A.
Figure 4A:
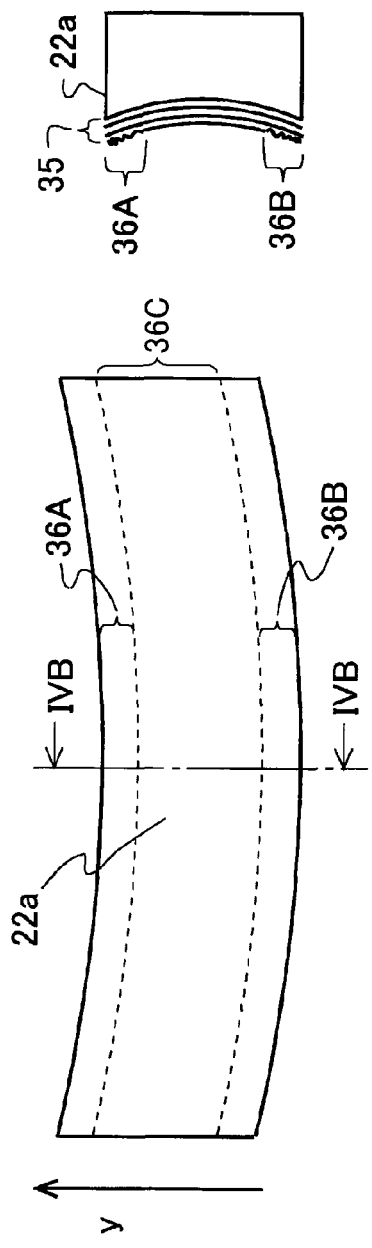
FIG. 4A is a magnified view of a reflecting surface of a mirror element 22a of the first embodiment.

The reflecting surface of each of the mirror elements 22a has a circular arc-shaped form in which a direction perpendicular to the y direction is the longitudinal direction; and the reflectance is substantially uniform (constant) in the direction perpendicular to the y direction of the mirror element 22a (more correctly, a direction extending along the circular arc-shaped edge) (see FIG. 4A). The reflectance of the mirror element 22a is maximized at the horizontal portion HS. The total of the widths of the inclined portions IS (2×my2) is for example about 5 to 30% with respect to a width in the y direction (my1−my2) at the position at which the reflectance of the mirror element 22a is ½ of the maximum value. In this case, the width my2 of the inclined portion IS disposed on one side is about 2.4 to 13% with respect to the entire width my1.

The large number of mirror elements 23a, which construct the second fly's eye optical system 23, have the reflecting surfaces which are, for example, flat surfaces. The reflectance distribution of the mirror element 23a is uniform (providing an approximately same value on the entire surface). The normal line directions of the reflecting surfaces of the respective mirror elements 23a may be different from each other.

The reflected lights from the mirror elements 22a respectively of the first fly's eye optical system 22, are collected onto and reflected by one or a plurality of corresponding mirror element or elements 23a of the second fly's eye optical system 23, respectively. It is assumed that f1 represents the focal length of each of the mirror elements 22a, and f2 (>>f1) represents the focal length of the condenser optical system constructed of the curved mirror 24 and the concave mirror 25. On this assumption, the illumination light EL reflected by the second fly's eye optical system 23 and passing through the aperture diaphragm AS forms, in a superimposed or overlay manner, images obtained by magnifying f2/f1-fold the reflecting surfaces of the respective mirror elements 22a (intensity distribution corresponding to the reflectance distribution) on the illumination area 27R of the reticle R.

That is, as representatively shown in FIG. 3, the reflected lights EL1, EL2, EL3 from mirror elements 22a, among the large number of mirror elements 22a, which are disposed at the end portion in the +y direction, the central portion, and the end portion in the -y direction, etc. of the first fly's eye optical system 22, form the magnified images of the reflecting surfaces of the mirror elements 22a in the superimposed or overlay manner on the illumination area 27R, as depicted by dotted lines, solid lines, and dashed lines respectively. As a result, even when the aperture of the aperture diaphragm AS has any shape, the intensity distribution IL(Y) in the Y direction of the illumination light EL, which is provided in the illumination area 27R, exhibits the distribution which is similar to the reflectance distribution rm(y) of each of the mirror elements 22a. When the distribution of the light, which includes the reflectance distribution, the transmittance distribution, and the intensity distribution, etc., is referred to in this specification, the distribution appropriately means the pattern of the distribution as described above. The terms "transmittance" and "transmittance distribution" generally mean the ratio of transmittance of the light and the distribution thereof. However, the optical element referred to in this specification includes not only the light-transmitting element but also the light-reflecting element. Therefore, the terms "transmittance" and "transmittance distribution" are used assuming that the terms mean the transmittance and the distribution thereof in relation to the transmission type element, and the terms mean the reflectance and the distribution thereof in relation to the light-reflecting element. As for the intensity distribution IL(Y) (trapezoidal pattern thereof), assuming that the entire width is RY1 and the widths of the inclined portions disposed on the both sides are RY2 respectively, the value of the ratio between the width RY2 of the inclined portion and the entire width RY1 is the same as the value of the ratio between the width my2 of the inclined portion and the entire width my1 of the reflectance distribution rm(y) as follows.

$$RY2/RY1 = my2/my1 \quad (1)$$

Assuming that the projection magnification of the projection optical system PO shown in FIG. 1 is, for example, ¼, the intensity distribution, which is obtained by reducing the intensity distribution IL(Y) of the illumination area 27R in the Y direction to ¼, is the trapezoidal intensity distribution (of the pattern) in the Y direction of the exposure area 27W on the wafer W.

Figure 6A:
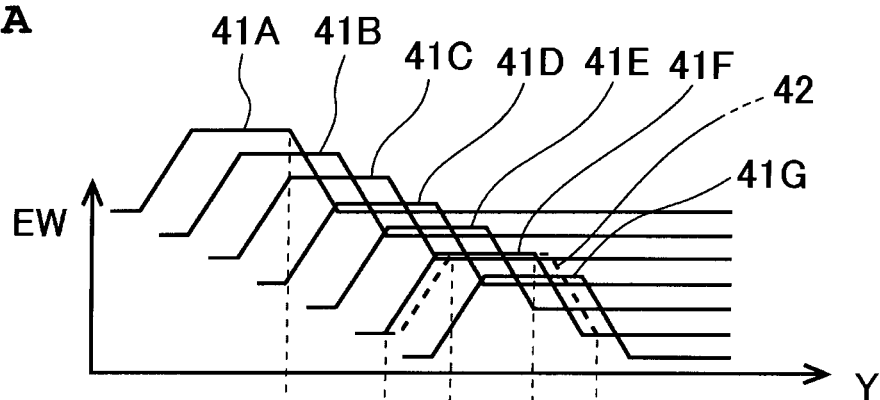
FIG. 6A shows change in the exposure amount on a wafer when the exposure is performed with a plurality of pulsed lights (pulsed light beams) each having a trapezoidal intensity distribution.
Figure 6B:
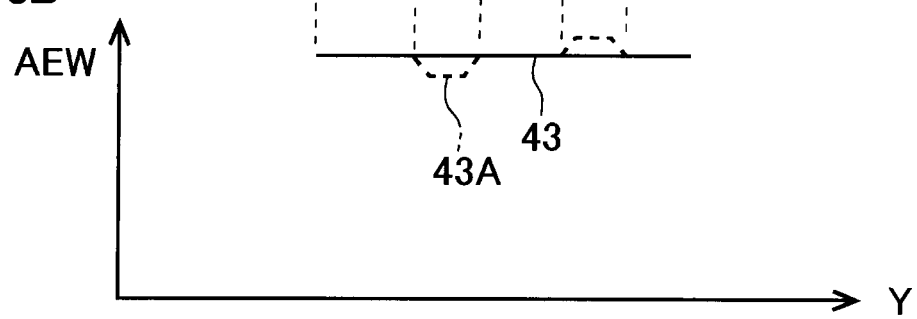
FIG. 6B shows the totalized exposure amount on the wafer corresponding to FIG. 6A.

In this case, it is assumed that the wafer W stands still, and the exposure area 27 is moved on the wafer W in the Y direction at a target relative velocity. On this assumption, as shown in FIG. 6A, an exposure amount EW on the wafer W, which is obtained by each pulse light emission of the illumination light EL, is represented by each of intensity distributions 41A to 41G of the pulsed lights which exhibit the trapezoidal patterns which are gradually shifted in the Y direction. In accordance with this, a totalized exposure amount AEW, which is obtained at the respective points in the Y direction on the wafer W after the scanning exposure, is flat as indicated by a straight line 43 shown in FIG. 6B. For example, even when the relative position of the pulsed light beam 41F shown in FIG. 6A is deviated to a position 42, for example, due to the jitter of the scanning velocity of the wafer stage WST, the unevenness in the totalized exposure amount AEW (unevenness in the scanning intensity) shown in FIG. 6B is suppressed to be small as indicated by dotted lines 43A, for the following reason. That is, the intensity distributions of the respective pulsed lights have the inclined portions. Therefore, even when the pulsed light is shifted in the Y direction, the intensity change corresponding thereto (shift amount in Y direction× inclination of inclined portion) is mitigated by the inclination of the inclined portion. In FIG. 6A, in order that the drawing is understood easily, the intensity distributions 41A to 41G are depicted while being deviated along the vertical axis. The intensities of the respective pulsed lights (maximum values of the intensity distributions 41A to 41G (heights of the horizontal portions)) are assumed to be identical with each other in this setting.

Figure 6C:
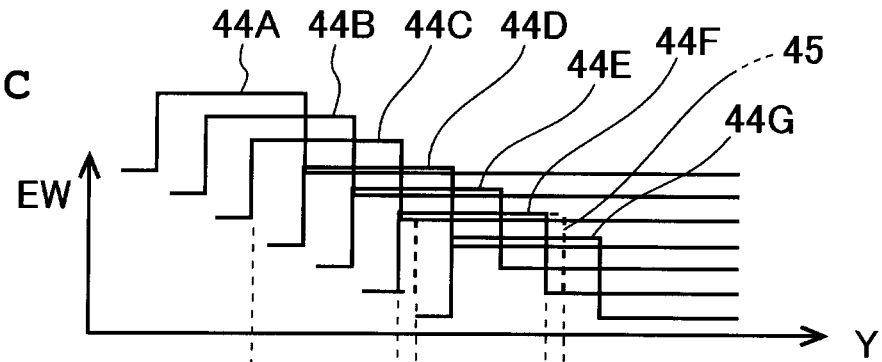
FIG. 6C shows the change in the exposure amount on the wafer when the exposure is performed with a plurality of pulsed lights each having a rectangular intensity distribution.
Figure 6D:
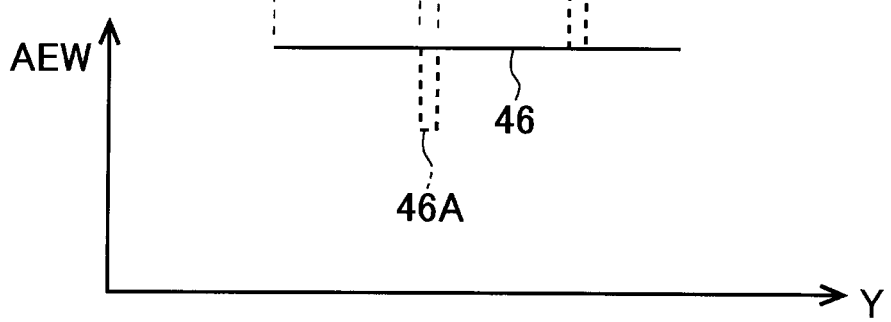
FIG. 6D shows the totalized exposure amount on the wafer corresponding to FIG. 6C.

On the other hand, if the intensity distribution in the Y direction of the exposure area 27W on the wafer W is rectangular, the exposure amount EW on the wafer W, which is obtained by each pulse light emission of the illumination light EL, is represented by each of the rectangular intensity distributions 44A to 44G shown in FIG. 6C. In this case, when there is no error in relation to the relative positions of the pulsed lights having the intensity distributions 44A to 44G respectively, a totalized exposure amount AEW in the Y direction on the wafer W after the scanning exposure is flat as depicted by a straight line 46 shown in FIG. 6C. However, for example, when the relative position of the pulsed light beam having the intensity distribution 44F shown in FIG. 6C is deviated to a position 45, the unevenness in the scanning intensity shown in FIG. 6D is increased as depicted by dotted lines 46A. Similarly, when the pulse energy of the illumination light EL is fluctuated, the unevenness in the scanning intensity is also increased when the intensity distribution of the exposure area 27W is rectangular.

In order to reduce the unevenness in the scanning intensity as described above, it is appropriate to increase the ratio of the width of the inclined portion of the intensity distribution of the exposure area 27W (illumination area 27R). However, if the width of the inclined portion is simply widened, it is necessary that the illumination optical system ILS and the projection optical system PO are made large-sized. Further, the exposure amount of each pulse light emission is decreased. Therefore, the width of the inclined portion is defined or set to be as narrow as possible, for example, on condition that the unevenness in the scanning intensity is suppressed to be within an allowable range.

For example, it is assumed that the light emission frequency of the illumination light EL (EUV light) is several kHz, and a width (slit width) in the Y direction, which is provided at a position at which the intensity of the exposure area 27W is ½ of the maximum value, is about 1.5 to 2 mm. On this assumption, when it is intended to suppress the scanning intensity unevenness to be about 0.1%, the width, which is required for the inclined portion of the intensity distribution, is about several 100 μm on one side. Therefore, the sum of the required widths of the inclined portions disposed on the both sides is about 10 to 20% with respect to the slit width. In this case, the intensity distribution in the Y direction of the exposure area 27W is similar to the intensity distribution IL(Y) in the Y direction of the illumination area 27R shown in FIG. 3 as well as the reflectance distribution rm(y) of each of the mirror elements 22a of the first fly's eye optical system 22. Therefore, it is preferable that the total (2×my2) of the widths of the inclined portions of the reflectance distribution is defined or set to be about 10 to 20% with respect to the width (my1−my2) at the position at which the reflectance of each of the mirror elements 22a is ½ of the maximum value.

In this embodiment, as shown in FIG. 3, the light fluxes, which are irradiated from or exit from the entire area (effective surface light source) (illumination σ) in the aperture of the aperture diaphragm AS respectively and which have the same distribution of the aperture angle or opening angle, are irradiated on the respective points on the entire surface of the illumination area 27R of the reticle R. That is, any one of illumination lights ELa, ELb, ELc irradiated, for example, onto the end portion in the −Y direction, the central portion, and the end portion in the +Y direction of the illumination area 27R is the light flux come from the entire surface of the aperture of the aperture diaphragm AS, and the illumination condition is identical among these illumination light ELa, ELb and ELc. Therefore, the pattern of the entire surface in the illumination area 27R is projected onto the wafer W by the projection optical system PO shown in FIG. 1 while providing the satisfactory imaging characteristic (for example, the resolution). For example, when the annular illumination is performed, the aperture of the aperture diaphragm AS (illumination σ) is annular, and the entire surface of the illumination area 27R is irradiated with the light fluxes from the annular illumination σ, i.e., the light fluxes having the conical surface-shaped distribution of the aperture angle respectively. Also in this case, the reflectance distributions of all of the mirror elements 22a of the first fly's eye optical system 22 are trapezoidal, and hence the intensity distribution of the illumination area 27R is trapezoidal, wherein the unevenness in the scanning intensity is suppressed.

Next, an explanation will be made with reference to FIGS. 4A to 4D about a first embodiment for obtaining the reflectance distribution rm(y) of the mirror element 22a of the first fly's eye optical system 22 shown in FIG. 3.

Figure 4C:
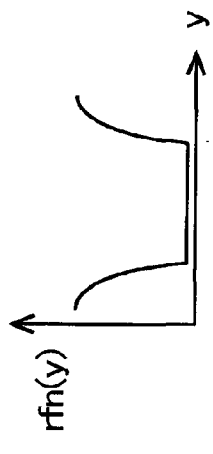
FIG. 4C shows a surface roughness distribution of the mirror element 22a shown in FIG. 4A.
Figure 4D:
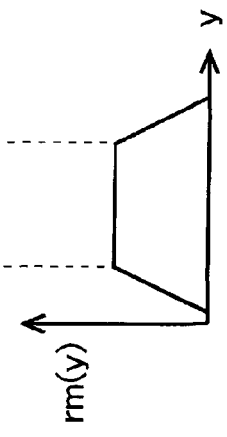

FIG. 4A shows a magnified view of the reflecting surface of the mirror element 22a shown in FIG. 3, FIG. 4B shows a sectional view taken along a line IVB-IVB shown in FIG. 4A, FIG. 4C shows a surface roughness distribution rfn(y) of the reflecting surface taken along the line IVB-IVB shown in FIG. 4A, and FIG. 4D shows a reflectance distribution rm(y) taken along the line IVB-IVB shown in FIG. 4A. As shown in FIG. 4A, the reflecting surface of the mirror element 22a has a circular arc-shaped form which is similar to the illumination area 27R. The reflecting surface of the mirror element 22a extends in an elongated form in a direction corresponding to the non-scanning direction. More specifically, the width in the y direction (transverse direction) of the mirror element 22a corresponding to the Y direction (scanning direction) on the reticle R is defined to be narrow, for example, not more than about 1/10 with respect to the length in the longitudinal direction (direction corresponding to the X direction on the reticle R) perpendicular thereto. The shape of the reflecting surface of the mirror element 22a is defined based on the shape of the required illumination area 27R on the reticle R.

Reflectance-adjusting areas 36A, 36B, which are defined by the widths my2 shown in FIG. 3 from the both ends in the y direction, are defined or set on the reflecting surface of the mirror element 22a. The reflectance of each of the reflectance-adjusting areas (transmittance-decreasing portions) 36A, 36B is decreased toward the end (outer side) thereof. On the other hand, a central portion 36C of the reflecting surface has a constant reflectance.

As shown in FIG. 4B, the mirror element 22a has the following basic structure. That is, for example, a surface of a member formed of silica glass (or highly heat resistant metal or the like) is processed highly accurately into a predetermined curved surface, and then a multilayered film 35, for example, a multilayered film of molybdenum and silicon, which reflects the EUV light, is formed on the surface. Further, in this embodiment, the surface roughness distribution rfn(y) of the multilayered film 35 in each of the reflectance-adjusting areas 36A, 36B is gradually increased continuously (or in a stepwise manner) toward the end thereof as shown in FIG. 4C. The following procedure is available in order to obtain the surface roughness distribution as described above. That is, for example, an ion beam or an electron beam is radiated onto the surface of the multilayered film 35 of the mirror element 22a while converging the ion beam or the electron beam, and the radiation time is adjusted depending on the required surface roughness.

In this case, assuming that α represents the surface roughness, then the reflectance r(α) is decreased exponentially in accordance with the expression of Debye-Waller as follows. It is noted that k and c represent proportional coefficients.

$$r(\alpha) = k \cdot \exp(-c \cdot \alpha^2) \quad (2)$$

Therefore, the surface roughness α of the multilayered film 35 of the mirror element 22a is defined to be increased toward the end in the y direction as depicted by the surface roughness distribution rfn(y) shown in FIG. 4C so that the reflectance r(α) provides the trapezoidal reflectance distribution rm(y) shown in FIG. 4D. By controlling the surface roughness distribution as described above, it is possible to easily set or define the reflectance distribution of the mirror element 22a to be the trapezoidal distribution as the target.

Next, an explanation will be made with reference to FIGS. 5A to 5D about a second embodiment for obtaining the reflectance distribution rm(y) of the mirror element 22a of the first fly's eye optical system 22 shown in FIG. 3.

Figure 5B:
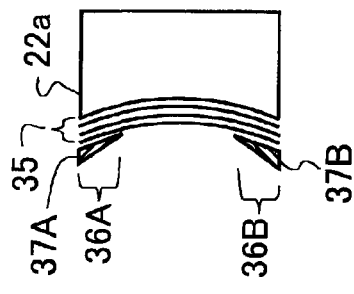
FIG. 5B shows a sectional view taken along a line VB-VB shown in FIG. 5A.
Figure 5A:
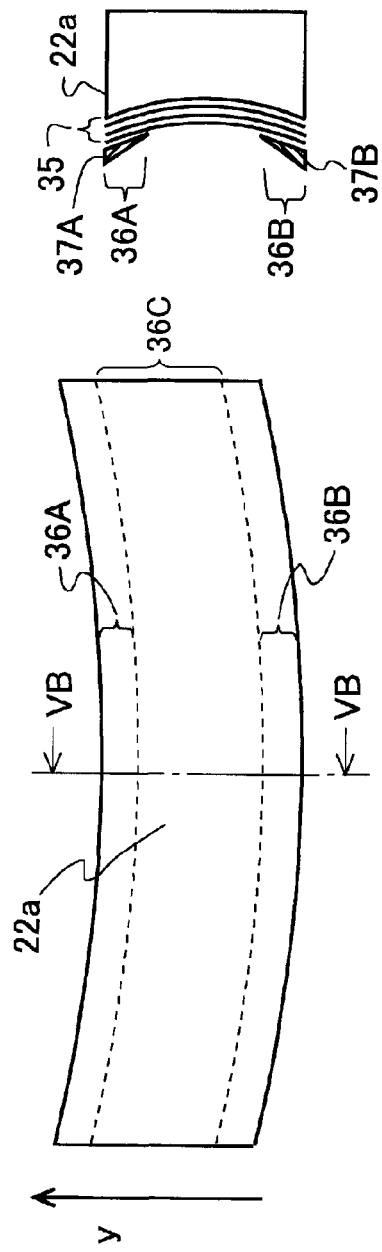
FIG. 5A is a magnified view of a reflecting surface of a mirror element 22a of a second embodiment.
Figure 5C:
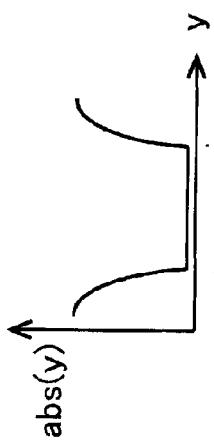
FIG. 5C shows a thickness distribution of an absorbing layer of the mirror element 22a shown in FIG. 5A.
Figure 5D:
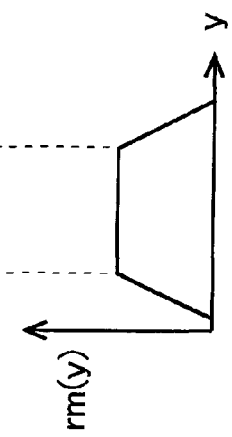

FIG. 5A shows a magnified view of the reflecting surface of the mirror element 22a shown in FIG. 3, FIG. 5B shows a sectional view taken along a line VB-VB shown in FIG. 5A, FIG. 5C shows a thickness distribution abs(y) of absorbing layers of the reflecting surface taken along the line VB-VB shown in FIG. 5A, and FIG. 5D shows a reflectance distribution rm(y) taken along the line VB-VB shown in FIG. 5A.

As shown in FIG. 5B, the absorbing layers 37A, 37B for absorbing the EUV light, in each of which the film thickness is gradually increased toward the outer side continuously (or in a stepwise manner), are added to reflectance-adjusting areas 36A, 36B on the multilayered film 35 (reflecting surface) of the mirror element 22a. Each of the absorbing layers 37A, 37B is formed of a material absorbing the EUV light which includes, for example, tantalum (Ta), nickel (Ni), and chromium (Cr). In this case, the reflectance is more lowered at portions at which the absorbing layers 37A, 37B are thicker. Therefore, the thickness distribution abs(y) of the absorbing layer is defined or set as shown in FIG. 5C so that the trapezoidal reflectance distribution rm(y) shown in FIG. 5D is obtained. The material for the absorbing layers 37A, 37B as described above is same as the material which is used when the circuit pattern is formed on the reflecting surface of the reticle R. Therefore, the reflectance distribution of the mirror element 22a can be easily defined or set to the trapezoidal distribution as the target by using approximately same production steps as the production steps of producing the reticle R.

The effects of the embodiments of the present invention are as follows.

(1) In the illumination optical system ILS of the embodiment of the present invention, the illumination light EL supplied from the laser plasma light source 10 is allowed to come into the optical integrator constructed of the fly's eye optical systems 22, 23; and the light fluxes, from the plurality of mirror elements 22a constructing the optical integrator, are irradiated onto the illumination area 27R on the reticle R. In the illumination optical system, the light-incident surface for the illumination light EL of each of the mirror elements 22a has the width in the y direction (transverse direction) which is narrower than the width in the direction perpendicular thereto; and the reflectance distribution (transmittance distribution in a broad sense) in the y direction of the mirror element 22a is defined or set to be the nonuniform distribution, i.e., the trapezoidal distribution in the embodiment of the present invention.

Therefore, the shape of the illumination area 27R is the elongated shape which is suitable for the scanning exposure. The light fluxes from the plurality of mirror elements 22a are irradiated onto the illumination area 27R in the superimposed manner; and the intensity distribution of the illumination area 27R is trapezoidal in the Y direction (scanning direction) corresponding to the y direction. Therefore, the unevenness after the scanning exposure in the scanning intensity is reduced. In particular, there is no need to use the blind arranged in the vicinity of the pattern surface of the reticle (or the conjugate surface thereof), unlike the conventional technique, for the purpose of obtaining the trapezoidal shape of the intensity distribution of the illumination light irradiated onto the illumination area 27R. Therefore, the respective points in the illumination area 27R are illuminated with the light fluxes from the entire area in the aperture of the aperture diaphragm AS (illumination σ), the light fluxes having approximately the same aperture angle (under the same illumination condition). Therefore, the image of the pattern of the entire surface of the illumination area 27R can be formed on the wafer W while providing the satisfactory imaging characteristic.

(2) The exposure apparatus 100 of the embodiment of the present invention is provided with the illumination optical system ILS of the embodiment of the present invention, and the projection optical system PO projecting, onto the surface of the wafer W arranged on the image plane, the image of the pattern of the reticle R which is illuminated with the illumination optical system ILS and which is arranged on the object plane. The image of a part of the pattern is projected onto the wafer W via the projection optical system PO, while synchronously moving the reticle R and the wafer W in the Y direction (scanning direction) corresponding to the y direction of the mirror element 22a of the illumination optical system ILS.

According to the exposure apparatus 100, the intensity distribution of the illumination area 27R of the reticle R can be made trapezoidal in the scanning direction, and the entire surface of the illumination area 27R can be illuminated under the same illumination condition. Therefore, the unevenness in the scanning intensity can be reduced, and the surface of the wafer W can be exposed with the image of the pattern of the reticle R highly accurately after the scanning exposure.

(3) The exposure apparatus 100 of the embodiment of the present invention includes the illumination optical system ILS in which the illumination light EL supplied from the laser plasma light source 10 is allowed to come into the optical integrator constructed of the fly's eye optical systems 22, 23, and the light fluxes from the plurality of mirror elements 22a constructing the optical integrator are irradiated onto the illumination area 27R of the pattern surface of the reticle R. The exposure apparatus 100 of the embodiment of the present invention further includes the projection optical system PO which projects the image of the pattern onto the surface (second surface) of the wafer W. The image of the part of the pattern is projected onto the wafer W via the projection optical system PO, while synchronously moving the reticle R and the wafer W in the Y direction (scanning direction) as the transverse direction of the illumination area 27R. In the exposure apparatus, the transmittance distribution in the y direction corresponding to the Y direction of the mirror element 22a is not uniform, i.e., the transmittance distribution is trapezoidal in the embodiment of the present invention.

According to the exposure apparatus, the intensity distribution of the illumination area 27R can be made trapezoidal in the scanning direction, and the entire surface of the illumination area 27R can be illuminated under the same illumination condition. Therefore, the unevenness in the scanning intensity can be reduced, and the surface of the wafer W can be exposed with the image of the pattern of the reticle R highly accurately after the scanning exposure. It is unnecessary to provide the blind for the exposure apparatus unlike the conventional technique, and it is unnecessary to adjust the light-exit direction of the light flux from the element of the optical integrator and/or the illumination area formed by the element of the optical integrator. Therefore, it is possible to simplify the structure of the exposure apparatus.

Next, Comparative Examples, which are comparable with the embodiments of the present invention, will be explained with reference to FIGS. 11 and 12.

Figure 11A:
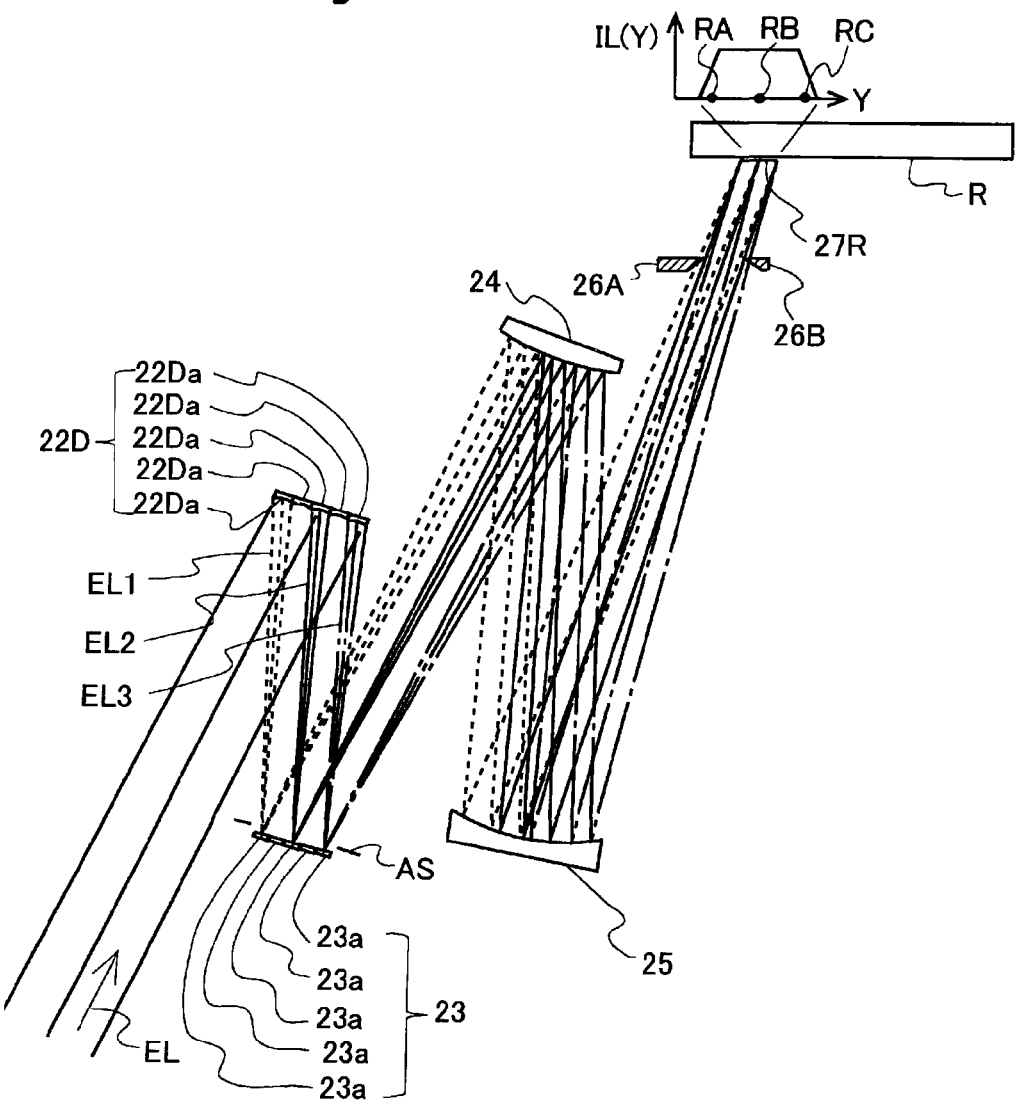
FIG. 11A shows main components of an illumination optical system of First Comparative Example.

FIG. 11A shows an illumination optical system of First Comparative Example in which a blind (aperture diaphragm) is used. In FIG. 11A in which parts or components corresponding to those shown in FIG. 3 are designated by the same or similar reference numerals, a first fly's eye optical system 22D, which is constructed of a large number of mirror elements 22Da each having uniform reflectance distribution over the entire surface thereof, is arranged instead of the first fly's eye optical system 22 shown in FIG. 3. Further, blinds 26A, 26B, which slightly shield the both end portions in the Y direction of the illumination light EL to be irradiated onto the illumination area 27R, are arranged in the vicinity of the pattern surface of the reticle R. The intensity distribution IL(Y) in the Y direction of the illumination area 27R is defined or set to be trapezoidal by defocused edge portions of the blinds 26A, 26B.

Figure 11B:
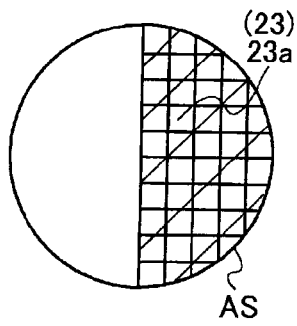
FIG. 11B shows an example of the lack of the illumination σ.
Figure 11C:
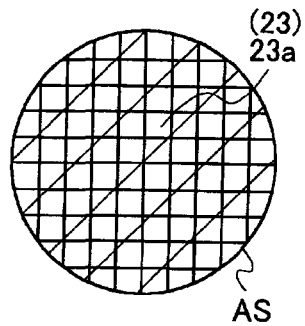
FIG. 11C shows a state in which no lack is prevent in the illumination σ.
Figure 11D:
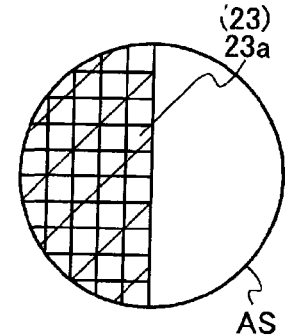
FIG. 11D shows another example of the lack of the illumination σ.

In First Comparative Example, the illumination light EL, which is irradiated onto the central portion (for example, at a position RB) of the illumination area 27R, is composed of the light fluxes from the entire area in the aperture of the aperture diaphragm AS (illumination σ), i.e., the light fluxes from all of the mirror elements 23a of the second fly's eye optical system 23 in the aperture as shown in FIG. 11C. However, the illumination light EL, which is irradiated onto an area disposed at the end portion in the −Y direction of the illumination area 27R (for example, at a position RA), is composed of light fluxes which lack the light fluxes from the area in the direction corresponding to the −Y direction in the illumination σ as shown in FIG. 11B. On the other hand, the illumination light EL, which is irradiated onto an area disposed at the end portion in the +Y direction of the illumination area 27R (for example, at a position RC), is composed of light fluxes which lack the light fluxes from the area in the direction corresponding to the +Y direction in the illumination σ as shown in FIG. 11D. Therefore, the lack of the illumination σ is caused in the area in which the intensity distribution of the illumination area 27R is inclined, and hence the imaging characteristic of the image of such area is deteriorated.

Figure 12A:
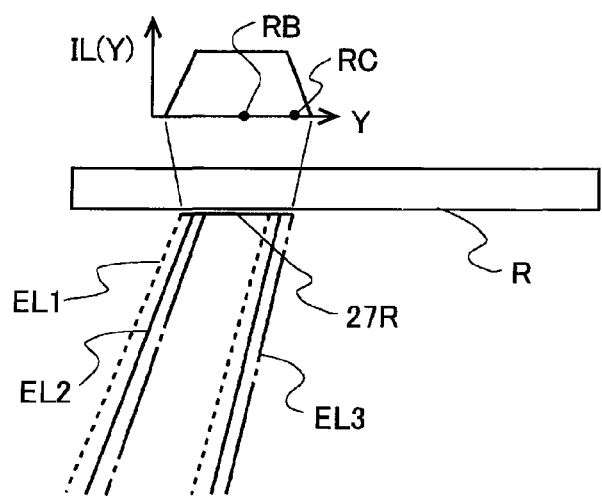
FIG. 12A shows an illumination light of Second comparative example.

FIG. 12A shows main parts or components of an illumination optical system of Second Comparative Example in which light fluxes from a plurality of mirror elements are shifted in the scanning direction. In Second Comparative Example shown in FIG. 12A, the angles of the reflected lights from the large number of mirror elements 23a constructing the second fly's eye optical system 23 shown in FIG. 11A are gradually widened in the direction corresponding to the Y direction, and the blinds 26A, 26B are omitted. In this case, for example, the illumination lights EL1, EL2, EL3, from the mirror elements 22Da disposed at one end portion, the central portion, and the other end portion of the first fly's eye optical system 22D shown in FIG. 11A, are irradiated while being shifted to an area in the −Y direction, an area of the central portion, and an area in the +Y direction of the illumination area 27R as shown in FIG. 12A. Therefore, the trapezoidal intensity distribution IL(Y) is defined or set.

Figure 12B:
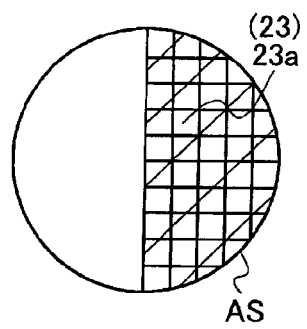
FIG. 12B shows an example of the lack of the illumination σ.
Figure 12C:
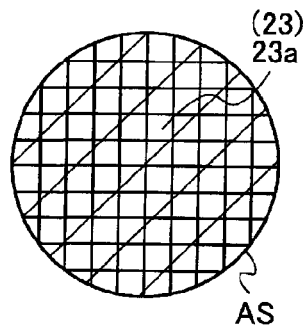
FIG. 12C shows a state in which no lack is present in the illumination σ.

In Second Comparative Example, as shown in FIG. 12C, the illumination light EL, which is irradiated onto the central portion (for example, at a position RB) of the illumination area 27R, is composed of the light fluxes from the mirror elements 23a of the second fly's eye optical system 23 in the aperture of the aperture diaphragm AS (FIG. 11A) (illumination σ). However, the illumination light EL, which is irradiated onto an area disposed at the end portion in the +Y direction of the illumination area 27R (for example, at a position RC), is composed of light fluxes which lack the light fluxes from the area in the direction corresponding to the −Y direction in the illumination σ as shown in FIG. 12B. In this way, the lack of the illumination σ is caused in the area in which the intensity distribution of the illumination area 27R is inclined, and hence the imaging characteristic of the image of such area is deteriorated.

Figure 12D:
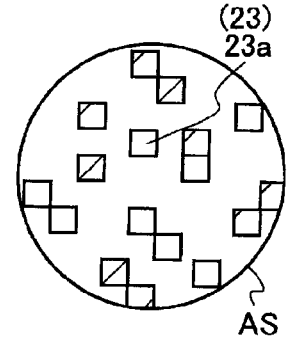
FIG. 12D shows another example of the lack of the illumination σ.

The trapezoidal intensity distribution can be also obtained by randomly changing the direction of the reflected light from the mirror element 23a of the second fly's eye optical system 23 in relation to FIG. 11A. However, in this case, the illumination light EL, which is irradiated onto the area disposed at the end portion in the +Y direction of the illumination area 27R (for example, at the position RC) shown in FIG. 12A, is composed of the light fluxes from a part of the areas (partial areas) in the illumination σ as shown in FIG. 12D. Therefore, the lack of the illumination σ is caused, and hence the imaging characteristic of the image of such area is deteriorated.

According to the embodiments of the present invention described above in contrast to First and Second Comparative Examples as described above, the lack of the illumination σ is not caused on the entire surface of the illumination area 27R. Therefore, the satisfactory imaging characteristic is obtained on the entire surface of the illumination area 27R.

Next, a modification of the embodiment of the present invention will be explained with reference to FIG. 7. An illumination optical system ILS shown in FIG. 7, in which parts or components corresponding to those shown in FIG. 3 are designated by the same or similar reference numerals, includes a first fly's eye optical system 22A which is arranged instead of the first fly's eye optical system 22 shown in FIG. 3 and which is constructed of a large number of mirror elements 22Aa wherein a reflectance distribution rm(y) provided in the y direction corresponding to the Y direction (scanning direction) of the reticle R is defined or set to have a trapezoidal shape with only one inclined side. That is, the reflectance distribution rm(y) of the mirror element 22Aa having the width my1 in the y direction is suddenly increased from zero to the maximum value at the end portion in the −y direction, and the reflectance distribution rm(y) is gradually decreased from the maximum value to zero while providing the width my2 at the end portion in the +y direction. In this case, the width my2 of the inclined portion is, for example, about 2.5 to 15%, and preferably about 5 to 10% with respect to the width (my1−my2).

A blind (field diaphragm) 26A, which shields the end portion in the −Y direction of the illumination light irradiated onto the illumination area 27R, is arranged in the vicinity of the pattern surface of the reticle R. Further, a driving mechanism (not shown) is provided to finely adjust the position in the Y direction of the blind 26A. Parts or components other than the above are constructed in the same manner as in the embodiment shown in FIG. 3.

Figure 7:
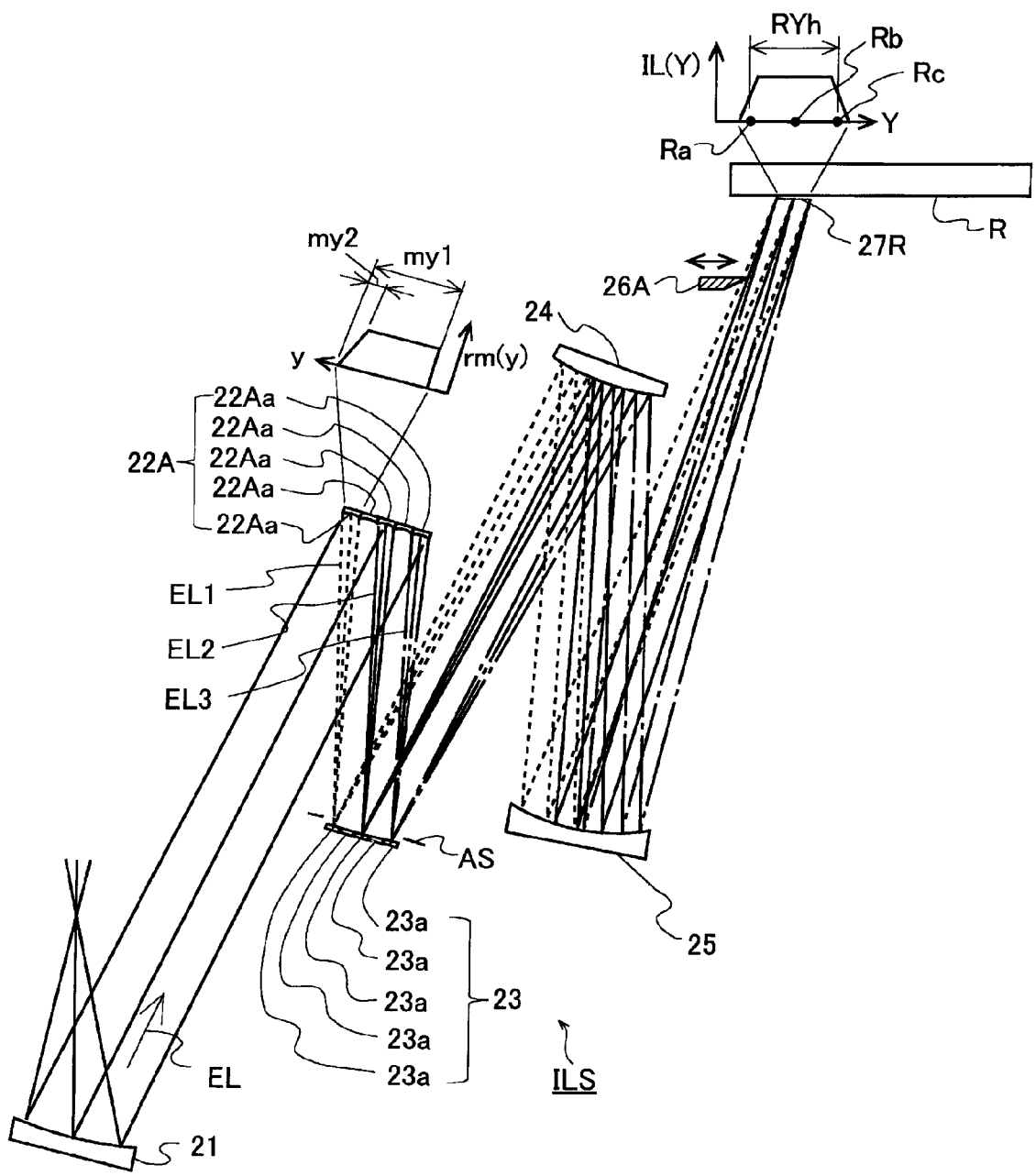
FIG. 7 shows an illumination optical system and a reticle of a modification of the embodiment.

According to the modification shown in FIG. 7, the intensity distribution at the end portion in the +Y direction of the illumination area 27R is inclined depending on the reflectance distribution of the mirror element 22Aa, and the intensity distribution at the end portion in the −Y direction of the illumination area 27R is inclined by the image of the defocused edge portion of the blind 26A. Therefore, the intensity distribution IL(Y) in the Y direction (scanning direction) of the illumination area 27R is trapezoidal. In this modification, the lack of the illumination σ is not caused at the central portion (for example, at a position Rb) of the illumination area 27R and at the end portion in the +Y direction (for example, at a position Rc). On the other hand, the lack of the illumination σ is caused at the end portion in the −Y direction of the illumination area 27R (for example, at a position Ra), because of the shielding by the blind 26A. However, the influence of the lack of the illumination σ is ½ as compared with the case in which the blinds 26A, 26B are provided on the both sides of the illumination light as in Comparative Example shown in FIG. 11A. Therefore, a relatively satisfactory imaging characteristic is obtained on the wafer after the scanning exposure owing to the averaging effect brought about by the scanning exposure.

Further, in this modification, the width RYh in the Y direction (slit width on the reticle) at the position, at which the intensity of the intensity distribution IL(Y) is ½ of the maximum value, can be adjusted by adjusting the position in the Y direction of the blind 26A. Accordingly, it is possible to increase the number of parameters for controlling the totalized exposure amount on the wafer.

Next, another exemplary embodiment of the present invention will be explained with reference to FIG. 8. In this embodiment, the present invention is applied to an illumination optical system for performing the transmission illumination.

Figure 8A:
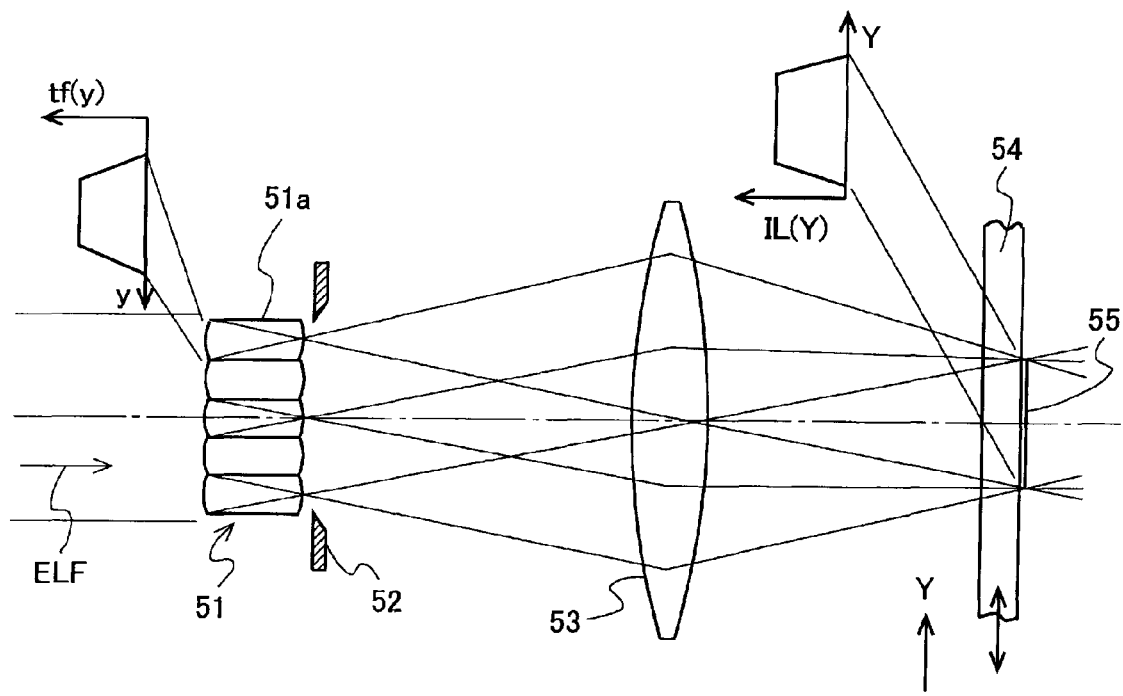
FIG. 8A shows main components of an illumination optical system of another exemplary embodiment of the present invention.

FIG. 8A shows main parts or components of an illumination optical system of this embodiment. With reference to FIG. 8A, an illumination light ELF having a wavelength of 193 nm, which is pulse-emitted from an unillustrated ArF excimer laser light source, is converted into a parallel light flux having a magnified cross-sectional shape by a beam-shaping optical system (not shown). After that, the illumination light ELF is allowed to come into a fly's eye lens 51 (optical integrator) constructed of a large number of two-dimensionally arranged minute lens elements 51a which have elongated and rectangular cross-sectional shapes. An aperture diaphragm 52, which has a variable aperture shape, is arranged in the vicinity of the light-exit surface of the fly's eye lens 51. The illumination light ELF, exiting from the fly's eye lens 51 and passing through the aperture diaphragm 52, illuminates, via a condenser lens system 53, an illumination area 55 of a pattern surface of a reticle 54 at a uniform illuminance distribution. The pattern in the illumination area 55 is projected onto a wafer (not shown) via a projection optical system (not shown) constructed of a dioptric system or a catadioptric system. For example, the light-exit surface of the fly's eye lens 51 is arranged in the vicinity of the front side focal plane of the condenser lens system 53, and the illumination area 55 is arranged on the rear side focal plane of the condenser lens system 53.

Also in this case, the reticle 54 is scanned during the exposure in the Y direction as the transverse direction of the illumination area 55, in synchronization with which the wafer is also scanned in the corresponding direction. The pattern surface of the reticle 54 is substantially conjugate with the light-incident surface of the fly's eye lens 51. The light-exit surface of the fly's eye lens 51 is the pupil plane of the illumination optical system, and the aperture diaphragm 52 is arranged in the vicinity of the pupil plane.

It is assumed that the y direction is the direction, on the light-incident surface of the fly's eye lens 51, which corresponds to the Y direction. On this assumption, the transmittance distribution (transmittance distribution in a narrow sense) tf(y) in the y direction of the light-incident surface of each of the lens elements 51a is trapezoidal in the same manner as the reflectance distribution rm(y) of the mirror element 22a shown in FIG. 3.

Figure 8B:
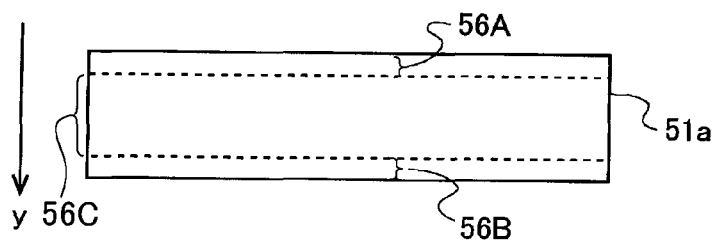
FIG. 8B is a magnified view of a lens element 51a of FIG. 8A.

FIG. 8B shows a magnified view of the light-incident surface of the lens element 51a shown in FIG. 8A. With reference to FIG. 8B, the cross-sectional shape of the lens element 51a is a rectangular shape which is long in a direction perpendicular to the y direction and which is similar to the illumination area 55. The transmittance is gradually decreased or lowered toward the end portion in each of transmittance-adjusting areas (transmittance-decreasing portions) 56A, 56B provided to have predetermined widths at both end portions in the y direction of the light-incident surface of the lens element 51a. On the other hand, a central portion 56c of the light-incident surface of the lens element 51a has a constant transmittance. The method for forming the transmittance distribution as described above includes, for example, a method in which the surface roughness is gradually increased toward the end portion in each of the transmittance-adjusting areas 56A, 56B of the lens element 51a, and a method in which a fine or minute pattern formed of a substance such as chromium or the like shielding the illumination light ELF is subjected to the coating by the vapor deposition, etc., at a density corresponding to the transmittance distribution.

According to this embodiment, with reference to FIG. 8A, the light-incident surface of each of the lens elements 51a of the fly's eye lens 51 is conjugate with the pattern surface of the reticle 54; and the images of the light-incident surfaces of the respective lens elements 51a of the fly's eye lens 51 in the aperture diaphragm 52 are formed in a superimposed or overlay manner in the illumination area 55. Therefore, the intensity distribution IL(Y) in the Y direction of the illumination area 55 also has a trapezoidal shape which is similar to the transmittance distribution tf(y) of the lens element 51a, and hence the unevenness in the scanning intensity is reduced. Further, the illumination light, from the entire area in the aperture of the aperture diaphragm 52, is irradiated onto the respective points of the illumination area 55. Therefore, the entire surface of the illumination area 55 is illuminated under the same illumination condition, and the surface of the wafer is exposed with the image of the entire surface while providing a satisfactory imaging characteristic.

The exposure method described in the embodiment described above will be briefly explained with reference to a flow chart shown in FIG. 9. In the embodiment described above, the fly's eye optical system is prepared as a part of the illumination optical system, having the plurality of optical elements which are arranged in the illumination optical system and which have the transmittance-adjusting areas (transmittance-decreasing portions) wherein the transmittance (reflectance or transmittance in a narrow sense) is gradually lowered in the predetermined direction corresponding to the scanning direction (S1). The light flux from the light source is allowed to come into the plurality of optical elements of the optical system, and the lights from the optical elements respectively are guided to the pattern surface (first plane) of the reticle R via the optical system (S2). Accordingly, the pattern surface of the reticle R is illuminated with the light fluxes having the same numerical aperture by the plurality of optical elements to thereby form the illumination area. Further, the image of the pattern existing in the illumination area is projected onto the wafer W (object) arranged on the image plane (second plane) of the projection optical system PL. In this procedure, an exposure area, which is conjugate with the illumination area, is formed on the wafer. In this state, by synchronously moving the reticle R and the wafer W in the scanning direction with respect to the illumination area and the exposure area, the image of the pattern is continuously transferred to a shot area on the wafer W (S3). The wafer is step-moved (S4) in order to perform the exposure for a next shot area.

In the embodiment shown in FIG. 3 described above, the image (primary image) of the reflecting surface of the mirror element 22a is formed in the illumination area 27R. However, an intermediate imaging optical system, which forms the image of the reflecting surface of the mirror element 22a (conjugate surface conjugate with the pattern surface of the reticle R) once or a plurality of times in the middle of the optical path, may be used instead of the curved mirror 24 and the concave mirror 25 (condenser optical system) included in the illumination optical system ILS. Similarly, also in the embodiment shown in FIG. 8A, an optical system, which performs the intermediate imaging, may be used instead of the condenser lens system 53.

In the embodiment shown in FIG. 1 described above, the laser plasma light source of the gas jet cluster system is used as the exposure light source. However, there is no limitation to this. For example, it is also allowable to use a laser plasma light source of the droplet system which uses, for example, stannum as the target. In the embodiments described above, the laser plasma light source is used as the EUV light source. However, there is no limitation to this. It is also allowable to use any one of, for example, the SOR (Synchrotron Orbital Radiation) ring, the betatron light source, the discharged light source (the discharge excitation plasma light source, the rotary type discharge excitation plasma light source, etc.), and the X-ray laser.

The embodiment shown in FIG. 1 is illustrative of the case in which the EUV light is used as the exposure light, and the all reflection projection optical system constructed of only the six mirrors is used. However, this construction is provided by way of example. The present invention is also applicable, for example, to an exposure apparatus provided with a projection optical system constructed of, for example, only four mirrors as disclosed in Japanese Patent Application Laid-open No. 11-345761 as a matter of course as well as to an exposure apparatus provided with a projection optical system having, for example, four to eight mirrors while using the light source of a VUV light source having a wavelength of 100 to 160 nm, for example, the $Ar_2$ laser (wavelength: 126 nm).

In the embodiments described above, the transmittance-adjusting areas are provided on the reflecting elements and/or the lens elements to provide, in the light intensity distribution as shown in each of FIGS. 3, 4D, and 8, the inclined portions in each of which the transmittance is linearly decreased or lowered at the end portion of the light intensity distribution in the direction corresponding to the scanning direction. However, the transmittance may be lowered non-linearly in the inclined portion.

The embodiments described above are each illustrative of the case in which the illumination optical system is incorporated into the exposure apparatus. However, the illumination optical system as explained in the embodiment is effective for such an usage that the object is relatively scanned across the light flux from the illumination optical system, other than the usage in the exposure apparatus. For example, the illumination optical system is usable for a detecting apparatus and a measuring apparatus in which the object is scanned across the illumination light.

Figure 9:
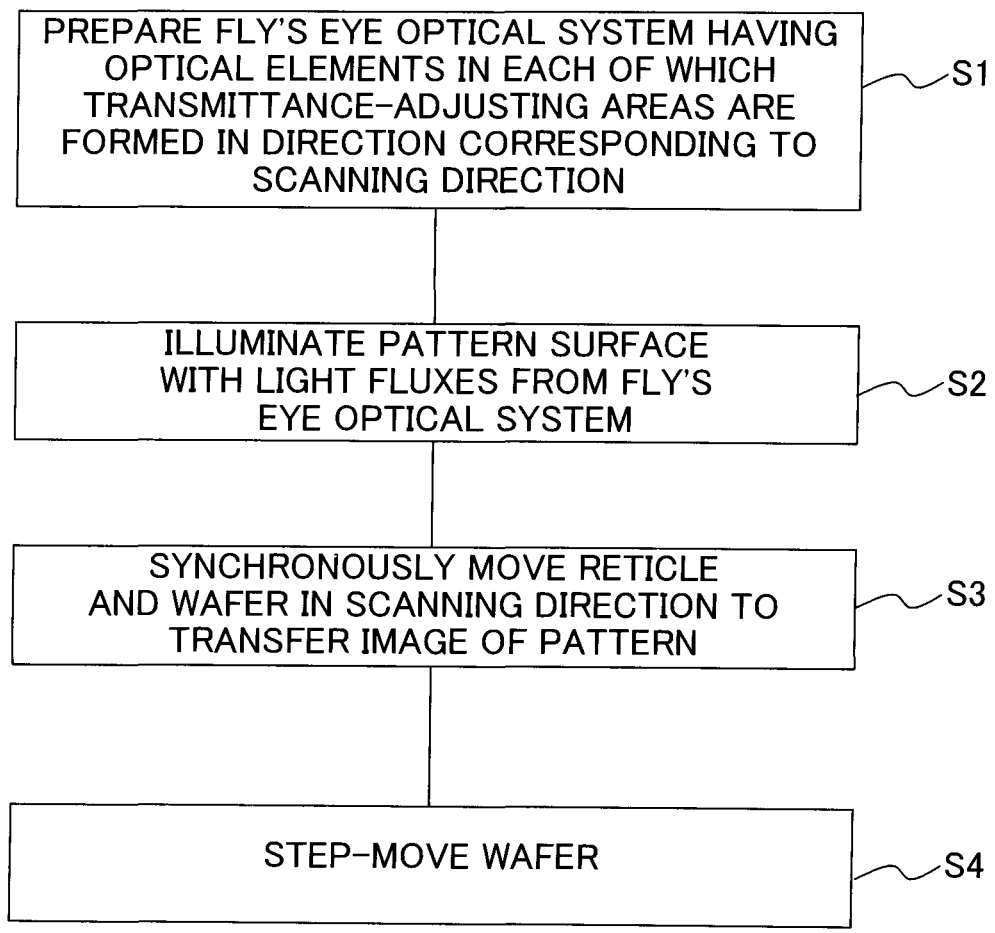
FIG. 9 shows a flow chart illustrating an outline of an exposure method of the embodiment.
Figure 10:
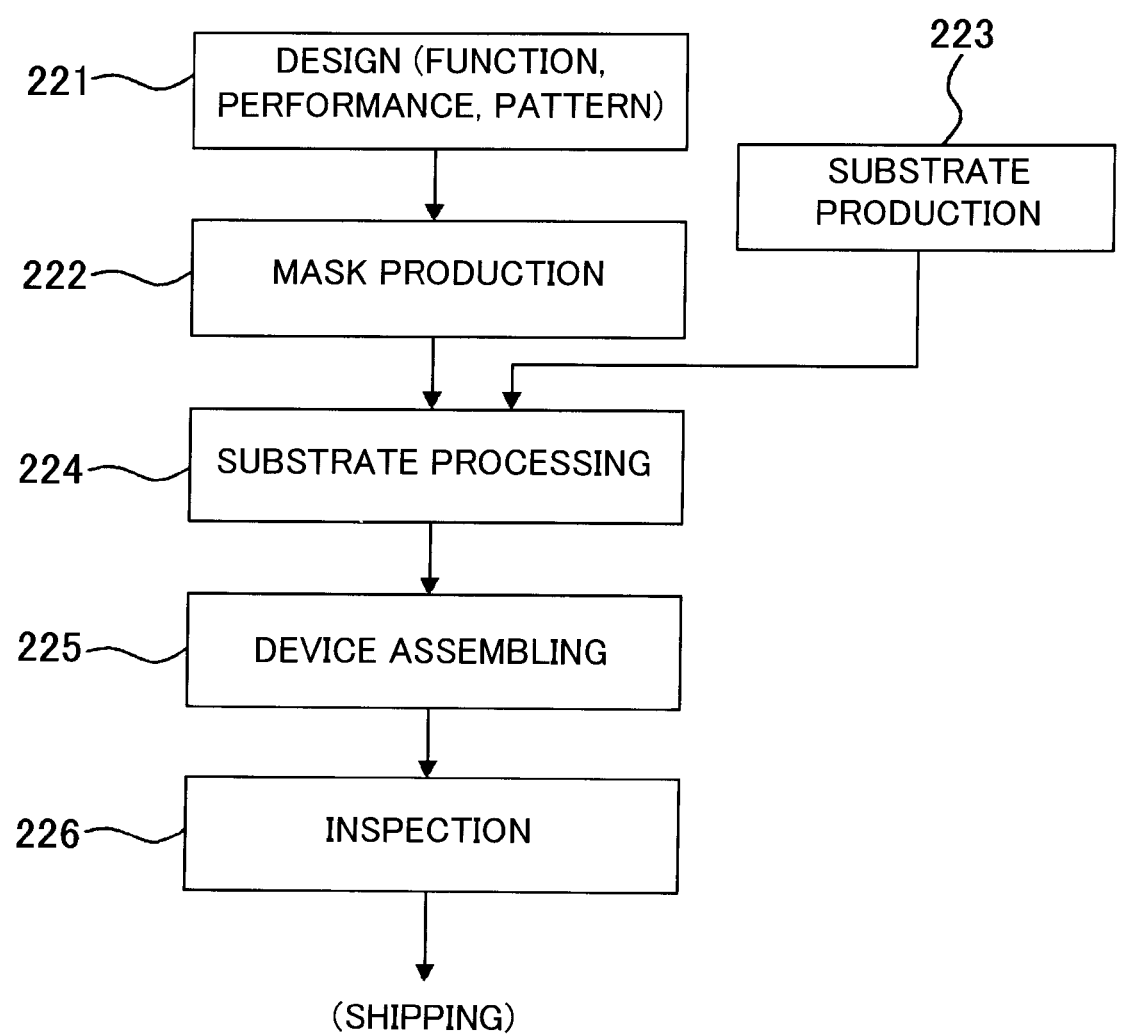
FIG. 10 shows a flow chart illustrating exemplary steps of producing a semiconductor device.

When an electronic device such as a semiconductor device (or a microdevice) is produced by using the exposure apparatus and the exposure method of the embodiment described above, the electronic device is produced by performing, for example, as shown in FIG. 10a step 221 of designing the function and the performance of the electronic device; a step 222 of manufacturing a mask (reticle) based on the designing step; a step 223 of producing a substrate (wafer) as a base material for the device and coating the substrate (wafer) with the resist; a substrate-processing step 224 including a step of exposing the substrate (photosensitive substrate) with the pattern of the mask by the exposure apparatus (EUV exposure apparatus or the like) of the embodiment described above or the exposure method as explained with reference to FIG. 9, a step of developing the exposed substrate, a step of heating (curing) and etching the developed substrate, etc.; a step 225 of assembling the device (including processing processes such as a dicing step, a bonding step, a packaging step, etc.); an inspection step 226; and the like.

In other words, the method for producing the device includes exposing the substrate (wafer) by using the exposure apparatus or the exposure method of the embodiment described above, and processing the exposed substrate (Step 224). In this procedure, according to the exposure apparatus and the exposure method of the embodiment described above, the unevenness in the scanning intensity is decreased, and the satisfactory imaging characteristic is obtained on the substrate. Therefore, a high-performance device can be produced highly accurately. The present invention is not limited to the embodiments described above, and may be embodied in other various forms without deviating from the gist or essential characteristics of the present invention.

The present invention is not limited to the application to the exposure apparatus or the exposure method for producing the semiconductor device. The present invention is also widely applicable, for example, to an exposure apparatus for a display device including a liquid crystal device, a plasma display, etc., and to an exposure apparatus and an exposure method (lithography method) for producing various devices including an image pickup device (CCD, etc.), a micromachine, a thin film magnetic head, a DNA chip, etc. Further, the present invention is applicable also to an exposure apparatus or an exposure method upon producing masks (for example, photomasks and reticles) formed with mask patterns of various devices by using the photolithography step.

The disclosures of various United States patents and United States patent application Publications referred to in this specification are incorporated herein by reference.

According to the present invention, the unevenness in the scanning intensity, which is caused due to the unevenness in the intensity of the illumination light, can be lowered when the object (such as a substrate) is scanned across the illumination light. Therefore, by using the illumination optical system of the present invention for the exposure of the substrate, it is possible to expose the substrate with the predetermined pattern while providing the excellent imaging characteristic, and it is possible to produce, accurately at the high throughput, a device which has a highly densified and complicated circuit pattern and which is used for the liquid crystal display element, the micromachine, etc.

What is claimed is:

1. An illumination optical system which irradiates a light flux from a light source onto an illumination objective surface, the illumination optical system comprising:
   an integrator having a plurality of reflecting elements into which the light flux from the light source comes and from which light fluxes exit respectively,
   wherein each of the reflecting elements, into which the light flux comes has a reflecting surface having a width in one direction narrower than a width in a direction perpendicular to the one direction; and
   the reflecting surface of each of the reflecting elements has a reflectance at a first point on the reflecting surface, a reflectance at a second point on the reflecting surface and a reflectance at a third point on the reflecting surface, the reflecting surface having two edges which intersect the one direction and a midpoint between the two edges along the one direction, the first, second and third points being arranged along the one direction such that the first point is between the midpoint and one of the two edges, the second point is between the first point and the one of the two edges and the third point is between the second point and the one of the two edges, the reflectance at the second point being smaller than the reflectance at the first point and the reflectance at the third point being smaller than the reflectance at the second point.

2. The illumination optical system according to claim 1, wherein a reflectance distribution in the one direction of the reflecting surface of each of the reflecting elements is trapezoidal.

3. The illumination optical system according to claim 1, wherein each of the reflecting elements is a mirror element.

4. The illumination optical system according to claim 3, wherein the reflecting surface of the mirror element has a surface roughness distribution in which a surface roughness differs in the one direction.

5. The illumination optical system according to claim 3, wherein a light-absorbing layer is formed on the reflecting surface of the mirror element, and the light-absorbing layer has a thickness distribution in which a thickness thereof differs.

6. The illumination optical system according to claim 3, wherein the light flux from the light source is an EUV light.

7. The illumination optical system according to claim 1, further comprising an optical system which guides, to the illumination objective surface, the light fluxes exiting from the reflecting elements.

8. The illumination optical system according to claim 1, wherein a reflectance in the one direction of the reflecting surface of each of the reflecting elements is gradually decreased toward at least one end of each of the reflecting elements such that an intensity distribution of the light flux in the illumination objective surface is gradually decreased toward at least one end of the illumination objective surface.

9. The illumination optical system according to claim 1, wherein the plurality of reflecting elements has identical reflectance distribution.

10. The illumination optical system according to claim 1, wherein a shape of an intensity distribution of the light flux on the illumination objective surface in a direction corresponding to the one direction is similar to a shape of a reflectance distribution in the one direction of the reflecting surface of each of the reflecting elements.

11. The illumination optical system according to claim 1, wherein a reflectance distribution in the one direction of the reflecting surface of each of the reflecting elements is represented by a shape having a horizontal portion which extends in the one direction and an inclined portion in which a light intensity is gradually decreased from the horizontal portion.

12. The illumination optical system according to claim 11, wherein a width, in the one direction, of the inclined portion of the reflectance distribution is 5 to 30% with respect to a width, in the one direction, of the reflectance distribution at a position at which the reflectance is ½ of a value at the horizontal portion.

13. The illumination optical system according to claim 1, wherein the width, in the one direction, of the reflecting surface of each of the reflecting elements is not more than about 1/10 with respect to the width, in the direction perpendicular to the one direction, of the reflecting surface of each of the reflecting elements.

14. The illumination optical system according to claim 1, wherein each of the plurality of reflecting elements has circular arc-shaped outer shape.

15. The illumination optical system according to claim 14, wherein the one direction is a direction orthogonal to a direction along a circular arc-shaped edge of the circular arc-shaped outer shape.

16. The illumination optical system according to claim 1, wherein a reflectance distribution of the reflecting surface of each of the reflecting elements is provided by applying a surface treatment to each of the reflecting elements.

17. The illumination optical system according to claim 1, wherein a reflectance in the one direction of the reflecting surface of each of the reflecting elements is linearly decreased toward the at least one end of the reflecting surface of each of the reflecting elements.

18. The illumination optical system according to claim 1, wherein a reflectance distribution, in the direction perpendicular to the one direction, of the reflecting surface of each of the reflecting elements is substantially uniform.

19. The illumination optical system according to claim 1, wherein a reflectance in the one direction of the reflecting surface of each of the reflecting elements is gradually decreased toward at least one end of the reflecting surface of each of the reflecting elements, the reflectance being a reflectance on a line parallel to the one direction.

20. An exposure apparatus which projects an image of a part of a pattern onto an object while synchronously moving the pattern and the object in a predetermined scanning direction, the exposure apparatus comprising:
an illumination optical system having an integrator including a plurality of reflecting elements into which a light flux from a light source comes and from which light fluxes exit respectively, the illumination optical system illuminating a first plane with the light fluxes from the reflecting elements; and
a projection optical system which projects the image of the pattern arranged on the first plane onto the object arranged on a second plane, a reflecting surface of each of the reflecting elements has a reflectance at a first point on the reflecting surface, a reflectance at a second point on the reflecting surface and a reflectance at a third point on the reflecting surface, the reflecting surface having two edges which intersect a one direction corresponding to the scanning direction and a midpoint between the two edges along the one direction, the first, second and third points being arranged along the one direction such that the first point is between the midpoint and one of the two edges, the second point is between the first point and the one of the two edges and the third point is between the second point and the one of the two edges, the reflectance at the second point being smaller than the reflectance at the first point and the reflectance at the third point being smaller than the reflectance at the second point.

21. The exposure apparatus according to claim 20, wherein the light source is an EUV light source.

22. The exposure apparatus according to claim 20, wherein the illumination optical system is provided with an aperture diaphragm, and all of the light fluxes, which pass through the aperture diaphragm, are irradiated onto the first plane.

23. The exposure apparatus according to claim 20, wherein a reflectance distribution of the reflecting surface, of each of the reflecting elements, in the one direction is represented by a shape having a horizontal portion which extends in the one direction and an inclined portion in which a light intensity is gradually decreased from the horizontal portion.

24. The exposure apparatus according to claim 20, wherein a shape, which represents a reflectance distribution of the reflecting surface of each of the reflecting elements in the one direction, is similar to a shape of an illumination area which is formed on the first plane by the illumination optical system and a shape of an exposure area which is formed on the second plane by the projection optical system.

25. A method for producing a device, comprising:
exposing an object by using the exposure apparatus as defined in claim 20; and
processing the exposed object.

26. The exposure apparatus according to claim 20, wherein the illumination optical system illuminates an illumination area on the first plane with the light fluxes from the reflecting elements, and an reflectance of the reflecting surface of each of the reflecting elements, in the one direction is gradually decreased toward at least one end of the reflecting surface of each of the reflecting elements such that an intensity distribution of the light fluxes in the illumination area is gradually decreased toward at least one end of the illumination area.

27. The exposure apparatus according to claim 20, wherein the plurality of reflecting elements has identical reflectance distribution.

28. The exposure apparatus according to claim 20, wherein each of the plurality of reflecting elements has circular arc-shaped outer shape.

29. The exposure apparatus according to claim 28, wherein the one direction is a direction orthogonal to a direction along a circular arc-shaped edge of the circular arc-shaped outer shape.

30. The exposure apparatus according to claim 20, wherein a reflectance distribution of the reflecting surface of each of the reflecting elements is provided by applying a surface treatment to each of the reflecting elements.

31. The exposure apparatus according to claim 20, wherein a reflectance of the reflecting surface of each of the reflecting elements in the one direction is linearly decreased toward the at least one end of the reflecting surface of each of the reflecting elements.

32. The exposure apparatus according to claim 20, wherein a reflectance distribution, in the direction perpendicular to the one direction, of the reflecting surface of each of the reflecting elements is substantially uniform.

33. The exposure apparatus according to claim 20, wherein a reflectance in the one direction of the reflecting surface of each of the reflecting elements is gradually decreased toward at least one end of the reflecting surface of each of the reflecting elements, the reflectance being a reflectance on a line parallel to the one direction.

34. An exposure method for exposing an object by projecting an image of a pattern onto the object, the exposure method comprising:
preparing an optical system in which a plurality of reflecting elements are arranged, the reflecting elements each having a reflectance-decreasing portion in which a reflectance is gradually decreased in a predetermined direction, a reflecting surface of each of the reflecting elements having a reflectance distribution which includes a reflectance at a first point on the reflecting surface, a reflectance at a second point on the reflecting surface and a reflectance at a third point on the reflecting surface; the reflecting surface having two edges which intersect the predetermined direction and a midpoint between the two edges along the predetermined direction; the first, second and third points being arranged along the predetermined direction such that the first point is between the midpoint and one of the two edges, the second point is between the first point and the one of the two edges and the third point is between the second point and the one of the two edges; the reflectance at the second point being smaller than the reflectance at the first point and the reflectance at the third point being smaller than the reflectance at the second point;
making a light flux from a light source come into the reflecting elements of the optical system to irradiate, onto a first plane, lights from the reflecting elements respectively; and
projecting the image of the pattern arranged on the first plane onto the object arranged on a second plane, while synchronously moving the pattern and the object in a scanning direction corresponding to the predetermined direction.

35. The exposure method according to claim 34, wherein the first plane is illuminated by the reflecting elements with the lights having an identical numerical aperture.

36. The exposure method according to claim 34, wherein the reflectance distribution, of the reflecting surface of each of the reflecting elements, in the predetermined direction is represented by a shape having a horizontal portion which extends in the predetermined direction and an inclined portion in which a light intensity is gradually decreased from the horizontal portion.

37. The exposure method according to claim 36, wherein a width, in the predetermined direction, of the inclined portion of the reflectance distribution is 5 to 30% with respect to a width, in the predetermined direction, of the reflectance distribution at a position at which the reflectance is ½ of a value at the horizontal portion.

38. A method for producing a device, comprising:
exposing an object by using the exposure method as defined in claim 34; and
processing the exposed object.

39. The exposure method according to claim 34, wherein the lights from the reflecting elements are irradiated onto an illumination area on the first plane, and, in the reflectance-decreasing portion, the reflectance is gradually decreased toward at least one end of the reflecting surface of each of the reflecting elements in a predetermined direction such that an intensity distribution of the lights in the illumination area is gradually decreased toward at least one end of the illumination area.

40. The exposure method according to claim 34, wherein the plurality of reflecting elements has identical reflectance distribution.

41. The exposure method according to claim 34, wherein a width, in the predetermined direction, of the reflecting surface of each of the reflecting elements is not more than about 1/10 with respect to a width, in a direction orthogonal to the predetermined direction, of the reflecting surface of each of the reflecting elements.

42. The exposure method according to claim 34, wherein each of the plurality of reflecting elements has circular arc-shaped outer shape.

43. The exposure method according to claim 42, wherein the predetermined direction is a direction orthogonal to a direction along a circular arc-shaped edge of the circular arc-shaped outer shape.

44. The exposure method according to claim 34, wherein the reflectance-decreasing portion is provided by applying a surface treatment to each of the reflecting elements.

45. The exposure method according to claim 34, wherein, in the reflectance-decreasing portion, the reflectance is linearly decreased toward the at least one end of the reflecting surface of each of the reflecting elements in the predetermined direction.

46. The exposure method according to claim 34, wherein a reflectance distribution, in the direction perpendicular to the predetermined direction, of the reflecting surface of each of the reflecting elements is substantially uniform.

* * * * *

UNITED STATES PATENT AND TRADEMARK OFFICE
CERTIFICATE OF CORRECTION

PATENT NO. : 9,030,645 B2  
APPLICATION NO. : 12/502474  
DATED : May 12, 2015  
INVENTOR(S) : Masayuki Shiraishi Page 1 of 1

It is certified that error appears in the above-identified patent and that said Letters Patent is hereby corrected as shown below:

In the claims,

Claim 20, col. 22, line 1, "a reflecting surface of each of the reflecting elements has a" should read --wherein a reflecting surface of each of the reflecting elements has a--.

Signed and Sealed this
Sixth Day of October, 2015

Michelle K. Lee
*Director of the United States Patent and Trademark Office*